US009934726B2

(12) United States Patent
Asano

(10) Patent No.: US 9,934,726 B2
(45) Date of Patent: *Apr. 3, 2018

(54) DISPLAY DEVICE HAVING SHARED COLUMN LINES

(71) Applicant: Sony Corporation, Tokyo (JP)

(72) Inventor: Mitsuru Asano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/645,456

(22) Filed: Jul. 10, 2017

(65) Prior Publication Data

US 2017/0309229 A1 Oct. 26, 2017

Related U.S. Application Data

(60) Continuation of application No. 15/282,075, filed on Sep. 30, 2016, now Pat. No. 9,711,086, which is a
(Continued)

(30) Foreign Application Priority Data

May 28, 2004 (JP) ................................. 2004-159378
May 28, 2004 (JP) ................................. 2004-159379

(51) Int. Cl.
*G09G 3/30* (2006.01)
*G09G 3/3233* (2016.01)
(Continued)

(52) U.S. Cl.
CPC ............. *G09G 3/3233* (2013.01); *G09G 3/30* (2013.01); *G09G 3/325* (2013.01); *G09G 3/3611* (2013.01);
(Continued)

(58) Field of Classification Search
CPC ........ G09G 3/3233; G09G 5/00; G09G 3/325; G09G 3/30; G09G 3/32; H01L 27/3276; H01L 27/3262

See application file for complete search history.

(56) References Cited

U.S. PATENT DOCUMENTS 5,285,301 A 2/1994 Shirahashi et al.
5,684,365 A 11/1997 Tang et al.
(Continued)

FOREIGN PATENT DOCUMENTS

JP 60-254654 A 12/1985
JP 03-007914 A 1/1991
(Continued)

OTHER PUBLICATIONS

Japanese Office Action No. 20004-159379 dated Oct. 10, 2007.
(Continued)

*Primary Examiner* — Pegeman Karimi
(74) *Attorney, Agent, or Firm* — Michael Best & Friedrich LLP

(57) ABSTRACT

A display device having at least a plurality of pixel circuits, connected to signal lines to which data signals in accordance with luminance information are supplied, arranged in a matrix, wherein pixel circuits of odd number columns and even number columns adjacent sandwiching an axis in a column direction parallel to an arrangement direction of the signal lines have a mirror type circuit arrangement symmetric about the axis of the column direction, and there are lines different from the signal lines between signal lines of adjacent pixel circuits.

20 Claims, 22 Drawing Sheets

Related U.S. Application Data continuation of application No. 14/932,620, filed on Nov. 4, 2015, now Pat. No. 9,460,669, which is a continuation of application No. 14/627,045, filed on Feb. 20, 2015, now Pat. No. 9,202,424, which is a continuation of application No. 14/452,771, filed on Aug. 6, 2014, now Pat. No. 8,988,327, which is a continuation of application No. 13/768,349, filed on Feb. 15, 2013, now Pat. No. 8,937,581, which is a division of application No. 12/923,635, filed on Sep. 30, 2010, now Pat. No. 8,519,915, which is a division of application No. 11/137,657, filed on May 26, 2005, now Pat. No. 8,378,930.

(51) Int. Cl.
  *G09G 3/325* (2016.01)
  *G09G 3/36* (2006.01)
  *G09G 5/00* (2006.01)
  *G09G 5/18* (2006.01)
  *H01L 27/12* (2006.01)
  *H01L 27/32* (2006.01)

(52) U.S. Cl.
  CPC ............ *G09G 3/3648* (2013.01); *G09G 5/00* (2013.01); *G09G 5/18* (2013.01); *H01L 27/124* (2013.01); *H01L 27/3248* (2013.01); *H01L 27/3262* (2013.01); *H01L 27/3265* (2013.01); *H01L 27/3276* (2013.01); *G09G 2300/0404* (2013.01); *G09G 2300/0426* (2013.01); *G09G 2300/0443* (2013.01); *G09G 2300/0819* (2013.01); *G09G 2300/0852* (2013.01); *G09G 2300/0861* (2013.01); *G09G 2300/0866* (2013.01); *G09G 2310/0251* (2013.01); *G09G 2310/061* (2013.01); *G09G 2320/0209* (2013.01); *G09G 2330/021* (2013.01)

(56) References Cited

U.S. PATENT DOCUMENTS

| | | | |
|---|---|---|---|
| 6,229,506 B1 | 5/2001 | Dawson et al. | |
| 6,229,508 B1 | 5/2001 | Kane | |
| 6,512,504 B1 | 1/2003 | Yamauchi et al. | |
| 6,618,029 B1 | 9/2003 | Ozawa | |
| 6,714,178 B2 | 3/2004 | Koyama et al. | |
| 7,236,149 B2 * | 6/2007 | Yamashita | G09G 3/3233 345/76 |
| 7,286,125 B2 | 10/2007 | Morita | |
| 8,519,915 B2 | 8/2013 | Asano | |
| 9,711,086 B2 * | 7/2017 | Asano | G09G 3/3233 |
| 2001/0002703 A1 * | 6/2001 | Koyama | G09G 3/3275 257/40 |
| 2001/0022572 A1 | 9/2001 | Murade | |
| 2001/0043168 A1 | 11/2001 | Koyama et al. | |
| 2002/0012077 A1 | 1/2002 | Fukami et al. | |
| 2003/0132931 A1 | 7/2003 | Kimura et al. | |
| 2003/0205968 A1 | 11/2003 | Chae et al. | |
| 2004/0145547 A1 | 7/2004 | Oh | |
| 2004/0217925 A1 | 11/2004 | Chung et al. | |
| 2004/0252565 A1 | 12/2004 | Yamazaki et al. | |
| 2005/0012686 A1 | 1/2005 | Osame et al. | |
| 2011/0032238 A1 | 2/2011 | Asano | |

FOREIGN PATENT DOCUMENTS

| | | |
|---|---|---|
| JP | 08-227283 | 9/1996 |
| JP | 08-234683 A | 9/1996 |
| JP | 09-305139 A | 11/1997 |
| JP | 11-024606 | 1/1999 |
| JP | 2001-083924 | 3/2001 |
| JP | 2002-514320 A | 5/2002 |
| JP | 2002-287653 | 10/2002 |
| JP | 2003-066868 | 3/2003 |
| JP | 2003-173165 | 6/2003 |
| JP | 2003-216109 | 7/2003 |
| JP | 2004-133240 A | 4/2004 |
| JP | 2004-246204 | 9/2004 |
| WO | WO-98/48403 | 10/1998 |

OTHER PUBLICATIONS

Japanese Office Action No. JP-2004-159378 dated Nov. 6, 2007.
Japanese Office Action dated May 26, 2009 for corresponding Japanese Application No. 2004-159379.
Japanese Office Action No. 2004-159379 dated Oct. 10, 2007.

* cited by examiner

| FIG. 7A SCAN(M) | OFF | ON | OFF | OFF |
|---|---|---|---|---|

| FIG. 7B SCAN(M+1) | OFF | OFF | ON | OFF |
|---|---|---|---|---|

| FIG. 7C SEL(N) | OFF | ON | OFF | OFF | ON | OFF | OFF | ON |
|---|---|---|---|---|---|---|---|---|

| FIG. 7D SEL(N+1) | OFF | OFF | ON | OFF | OFF | ON | OFF | OFF |
|---|---|---|---|---|---|---|---|---|

| FIG. 7E SEL(N+2) | ON | OFF | OFF | ON | OFF | OFF | ON | OFF |
|---|---|---|---|---|---|---|---|---|

…

DISPLAY DEVICE HAVING SHARED COLUMN LINES

CROSS REFERENCES TO RELATED APPLICATIONS

This is a Continuation Application of U.S. patent application Ser. No. 15/282,075, filed Sep. 30, 2016, which is a Continuation Application of U.S. patent application Ser. No. 14/932,620, filed Nov. 4, 2015, now U.S. Pat. No. 9,460,669 issued on Oct. 4, 2016, which is a Continuation Application of U.S. patent application Ser. No. 14/627,045, filed Feb. 20, 2015, now U.S. Pat. No. 9,202,424 issued on Dec. 1, 2015, which is a Continuation Application of U.S. patent application Ser. No. 14/452,771, filed Aug. 6, 2014, now U.S. Pat. No. 8,988,327, issued on Mar. 24, 2015, which is a Continuation Application of U.S. patent application Ser. No. 13/768,349 filed Feb. 15, 2013, now U.S. Pat. No. 8,937,581, issued on Jan. 20, 2015, which is a Divisional Application of U.S. patent application Ser. No. 12/923,635 filed Sep. 30, 2010, now U.S. Pat. No. 8,519,915, issued on Aug. 27, 2013, which is a Divisional Application of U.S. patent application Ser. No. 11/137,657 filed May 26, 2005, now U.S. Pat. No. 8,378,930, issued on Feb. 19, 2013, which claims priority from Japanese Patent Application No.2004-159378 and No.2004-159379 both filed in the Japan Patent Office on May 28, 2004, the entire contents of which being incorporated herein by reference.

BACKGROUND OF THE INVENTION

1. Field of the Invention

The present invention relates to a pixel circuit having an electrooptic element controlled in luminance by a signal line in an organic electroluminescence (EL) display device, liquid crystal display (LCD) device, or other active matrix display device and an interconnect structure and arrangement and circuit in an image display device in which these pixel circuits are arranged in a matrix.

2. Description of the Related Art

In an active matrix type display device, use is made of electrooptic elements such as liquid crystal cells and organic EL elements as display elements of pixels. Among them, an organic EL element has the structure of a layer made of an organic material, that is, an organic layer, sandwiched by electrodes. In this organic EL element, by applying a voltage to the element, electrons are injected from a cathode into the organic layer, holes are injected from an anode into the organic layer, electrons and holes are re-coupled as a result of this, and thereby light is emitted. This organic EL element has the following characteristics:

(1) A luminance of several hundreds to several tens of thousands of $cd/m^2$ is obtained by a low voltage drive of 10V or less, so it is possible to lower the power consumption.

(2) Being a self light emitting element, a contrast of the image is high and a response speed is fast, so the viewability is good, making this suitable for display of moving pictures.

(3) Being a completely solid element having a simple structure, it is possible to raise the reliability of the element and reduce the thickness.

An organic EL display device (hereinafter, described as an "organic EL display") using organic EL elements having these characteristics as the display elements of pixels is considered promising for next generation flat panel displays.

As the methods for driving an organic EL display, there can be mentioned the simple matrix method and active matrix method. Between these methods, the active matrix method has the following characteristics:

(1) The active matrix method is able to hold the light emission of the organic EL element at each pixel over a one frame period, so is suitable for raising the definition and raising the luminance of an organic EL display.

(2) The method enables preparation of peripheral circuits using thin film transistors on a substrate (panel), so enables simplification of the interface with the outside of the panel and raises the functions of the panel.

In an active matrix type organic EL display, generally use is made of polysilicon thin film transistors (TFTs) using polysilicon as the active layer for the transistors used as the active elements. The reason for this is that a polysilicon TFT has a high drivability and enables design of a small pixel size, so is advantageous for raising the definition.

While polysilicon TFTs have the characteristics explained above, it is widely known that they suffer from a large variation of characteristics. Accordingly, when polysilicon TFTs are used, suppression of the variation in characteristics and compensation for the variation of characteristics of TFTs circuit wise are major issues in active matrix type organic EL displays using the polysilicon TFTs. This is due to the following reasons.

Namely, this is because while a liquid crystal display using liquid crystal cells as the display elements of the pixels is configured to control the luminance data of the pixels by voltage values, an organic EL display is configured to control the luminance data of the pixels by current values.

Here, an active matrix type organic EL display will be explained in brief. FIG. 1 is a diagram of a general active matrix type organic EL display, while FIG. 2 is a circuit diagram of an example of the configuration of a pixel circuit of the active matrix type organic EL display (refer to for example U.S. Pat. No. 5,684,365 and Japanese Unexamined Patent Publication (Kokai) No. 8-234683).

In an active matrix type organic EL display 1, m×n pixel circuits 10 are arranged in a matrix, n number of columns' worth of signal lines SGL1 to SGLn driven by a data driver (DRV) 2 are arranged for each pixel column of the matrix array of these pixel circuits 10, and m number of rows' worth of scanning lines SCNL1 to SCNLm driven by a scan driver (SDRV) 3 are arranged for each pixel row.

Further, the pixel circuit 10 has, as shown in FIG. 2, a p-channel TFT 11, a n-channel TFT 12, a capacitor C11, and a light emitting element 13 made of an organic EL element. In the TFT 11 of each pixel circuit 10, a source is connected to a power supply potential line VCCL, and a gate is connected to a drain of the TFT 12. In the organic EL element 13, an anode is connected to the drain of the TFT 11, and a cathode is connected to a reference potential, for example, a ground potential GND. In the TFTs 12 of the pixel circuits 10, sources are connected to signal lines SGL1 to SGLn of corresponding columns, and gates are connected to the scanning lines SCNL1 to SCNLm of corresponding rows. One end of the capacitor C11 is connected to the power supply potential line VCCL, and the other end thereof is connected to the drain of the TFT 12.

Note that the organic EL element has a rectifying property in many cases, so is sometimes called an organic light emitting diode (OLED). Use is made of the symbol of a diode for the light emitting element in FIG. 2 and other figures, but a rectification property is not always required for the organic EL element in the following explanation.

In a pixel circuit 10 having such a configuration, at a pixel for writing luminance data, the pixel row including that pixel is selected by the scan driver 3 via the scanning line SCNL so that the TFTs 12 of the pixels of that row turn ON. At this time, the luminance data is supplied from the data driver 2 via the signal line SGL in the form of voltage and written into the capacitor C11 for holding the data voltage through the TFT 12. The luminance data written in the capacitor C11 is held over a one field period. This held data voltage is applied to the gate of the TFT 11. By this, the TFT 11 drives the organic EL element 13 by the current according to the held data. At this time, gradations of the organic EL element 13 are expressed by modulating the voltage Vdata (<0) between the gate and source of the TFT 11 held by the capacitor C11.

In general, the luminance Loled of an organic EL element is proportional to the current Ioled flowing through the element. Accordingly, the following equation (1) stands between the luminance Loled and the current Ioled of the organic EL element 13:

$$Loled \propto Ioled = k(Vdata - Vth)^2 \quad (1)$$

In Equation (1), $k=\frac{1}{4} \cdot \mu \cdot Cox \cdot W/L$. Here, $\mu$ is the mobility of the carriers of the TFT 11, Cox is a gate capacitance per unit area, W is a gate width of the TFT 11, and L is a gate length of the TFT 11. Accordingly, it is seen that variations of the mobility $\mu$ and the threshold voltage Vth (<0) of the TFT 11 exert an influence upon the variation of luminance of the organic EL element 13.

In this case, even for example when writing the same potential Vdata to different pixels, since the threshold value Vth of the TFT 11 varies according to the pixel, the current Ioled flowing through the light emitting element (OLED) 13 varies by a large extent and consequently becomes completely off from the desired value, so it is difficult to expect a high image quality of the display.

A large number of pixel circuits have been proposed in order to alleviate this problem. A representative example is shown in FIG. 3. (See for example U.S. Pat. No. 6,229,506 and FIG. 3 of Japanese Unexamined Patent Publication (Kohyo) No. 2002-514320.)

A pixel circuit 20 of FIG. 3 has a p-channel TFT 21, n-channel TFTs 22 to 24, capacitors C21 and C22, and an organic EL element 25 as a light emitting element. Further, in FIG. 3, SGL indicates a signal line, SCNL indicates a scanning line, AZL indicates an auto zero line, and DRL indicates a drive line. An explanation will be given of the operation of this pixel circuit 20 below by referring to the timing charts shown in FIGS. 4A to 4E.

As shown in FIGS. 4A and 4B, the drive line DRL and the auto zero line AZL are made a high level, and the TFT 22 and TFT 23 are made a conductive state. At this time, the TFT 21 is connected to the light emitting element (OLED) 25 in a diode connected state, therefore a current flows in the TFT 21.

Next, as shown in FIG. 4A, the drive line DRL is made a low level, and the TFT 22 is made a nonconductive state. At this time, when the scanning line SCNL is the high level, the TFT 24 is made conductive as shown in FIG. 4C, and a reference potential Vref is given to the signal line SGL as shown in FIG. 4D. The current flowing in the TFT 21 is shut off, therefore, as shown in FIG. 4E, a gate potential Vg of the TFT 21 rises, but the TFT 21 becomes the nonconductive state at the point of time when the potential rises up to VDD−|Vth|, so the potential is stabilized. This operation will be referred to as an "auto zero operation" below.

As shown in FIGS. 4B and 4D, the auto zero line AZL is made the low level, the TFT 23 is made the nonconductive state, and the potential of the signal line SGL is made a voltage lower than Vref by exactly ΔVdata. The change of this signal line potential lowers the gate potential of the TFT 21 by exactly ΔVg via the capacitor C21.

As shown in FIGS. 4A and 4C, when the scanning line SCNL is made the low level and the TFT 24 is made nonconductive, the drive line DRL is made the high level, the TFT 22 is made conductive, current flows in the TFT 21 and the light emitting element (OLED) 25, and the light emitting element 25 starts light emission.

When it is possible to ignore the parasitic capacitance, ΔVg and the gate potential Vg of the TFT 21 become as follows:

$$\Delta Vg = \Delta Vdata \times C1/(C1+C2) \quad (2)$$

$$Vg = V_{cc} - |Vth| - \Delta Vdata \times C1/(c1+C2) \quad (3)$$

Here, C1 indicates the capacitance value of the capacitor C21, and C2 indicates the capacitance value of the capacitor C22.

On the other hand, when the current flowing in the light emitting element (OLED) 25 at the time of the light emission is Ioled, the current value of this is controlled by the TFT 21 connected in series to the light emitting element 25. Assuming that the TFT 21 is operating in a saturated region, the following relationship is obtained by a well known equation of a MOS transistor and the above Equation (3):

$$Ioled = \mu CoxW/L/2(V_{cc} - Vg - |Vth|)^2 \quad (4)$$

$$= \mu CoxW/L/2(\Delta Vdata \times C1/(C1+C2))^2$$

Here, $\mu$ indicates the mobility of the carriers, Cox indicates the gate capacitance per unit area, W indicates the gate width, and L indicates the gate length.

According to Equation (4), Ioled is not controlled according to the threshold value Vth of the TFT 21, but by ΔVdata given from the outside. In other words, when the pixel circuit 20 of FIG. 3 is used, it is possible to realize a display device having a relatively high uniformity of the current and consequently uniformity of the luminance without influence of the threshold value Vth which varies for each pixel.

SUMMARY OF THE INVENTION

Focusing now on the issues to be dealt with in the present invention, since an organic EL element is current light emission type, it is necessary to supply a large current to the light emitting elements for display, so power supply potential lines become necessary other than the signal lines and the scanning lines for the individual pixels. In general, as shown in FIG. 1, when arranging matrix type pixel circuits, as shown in FIG. 5 and FIG. 6, they are arranged in a matrix by repeating pixel circuits having the same configuration and layout. Note that, in FIG. 5, the capacitors are omitted for simplification of the figure.

However, in the circuit arrangements shown in FIG. 5 and FIG. 6, it is necessary to provide power supply potential lines VCCL1 to VCCLn for supplying the power supply voltage VCC to the different pixel circuit columns. It is not possible to make the lines too wide due to the constraints in the circuit area. Further, as shown in FIG. 6, top sides of the plurality of power supply potential lines VCCL are not made common, therefore a potential difference arises between the tops and bottoms of the lines. As a result, as shown in FIG. 6, uneven luminance arises between the top and bottom of a screen.

On the other hand, generally a data signal is written into a voltage write type pixel circuit as follows. An explanation will be given of 1H period (horizontal scanning period) where the scanning line SCNL (M) is ON with reference to FIGS. 7A to 7E.

(1) A signal SCAN(M) for controlling the writing of the data signal from the signal line SGL(n) (n=N to N+2) into the pixel circuit "Pixel(M,N)" is made on for the 1H period. Namely, the data signal is written from the signal line into the pixel circuit for 1H period.

(2) On the other hand, by turning on the switches 2-N and 2-(N+1) and 2-(N+2) for controlling the writing of the data into the signal line for only part of 1H, the writing of the data into a plurality of signal lines is carried out in a time division manner.

In this case, when employing a circuit configuration as shown in FIG. 8 for the pixel circuit 10, there inevitably arises a situation where the signal lines SGL(N+1) and SGL(N+2) end up adjacent between adjacent pixels, therefore, the following problems arise.

Namely, when the signal line SGL(N+1) and signal line SGL(N+2) are adjacent, a selector switch 2-(N+1) turns on so the data is written into the signal line SGL(N+1), next the select switch 2-(N+1) turns OFF and the select switch 2-(N+2) turns ON so the data is written into the signal line SGL(N+2). At this time, since the signal line SGL(N+1) and the signal line SGL(N+2) are adjacent, a parasitic capacitance Cp(N+1,N+2) is formed. Accordingly, when the data of the signal line SGL(N+2) is written, the signal line potential of the signal line SGL(N+1) fluctuates, that is, the data is rewritten. Further, when rewriting this signal line SGL(N+1), the signal SCAN(M) is ON, therefore the rewriting of the data is reflected upon the pixel circuit "Pixel(M, N+1)".

As a result, in an arrangement where the signal lines between pixels are adjacent, rewriting of data between signal lines (crosstalk) occurs, therefore it is difficult to rewrite correct luminance data. Further, the above example was explained by using typical pixel circuits of an organic EL display device, but the same is also true for an organic EL display device using other pixel circuits for writing luminance data from the signal lines. Further, the same is also true for a liquid crystal display device using LCDs or other pixel circuits for writing luminance data from the signal lines.

Further, as mentioned above, when using pixel circuits 10 as shown in FIG. 2, due to the variation of the threshold value Vth of the transistors, the uniformity of the luminance between pixels is degraded, so it is difficult to form a high quality display device.

On the other hand, when using pixel circuits of FIG. 3, it is possible to realize a display device having a relatively high uniformity of luminance, but this has the following problems:

A first problem is that a gate amplitude $\Delta Vg$ of the drive transistor is reduced according to Equation (2) from the data amplitude $\Delta Vdata$ driven from the outside. Seen from another angle, it is necessary to give a large $\Delta Vdata$ in order to obtain the same $\Delta Vg$. This is undesirable in the points of power consumption and noise.

A second problem is that the explanation of operation concerning the pixel circuit 20 of FIG. 3 is only theoretical. In practice, the influence of the variation of Vth of the TFTs 21 for driving the light emitting elements (OLEDs) 25 may not be eliminated. This is because the auto zero line AZL and the gate node of each TFT 21 are coupled by the gate capacitance of the TFT 23. When the auto zero line AZL shifts to the high level and the TFT 23 becomes nonconductive, the channel charge of the TFT 23 flows into the gate node of the TFT 21. The reason for this will be explained next.

Namely, after the end of an auto zero operation, the gate potential of the TFT 21 ideally should be VDD−|Vth|, but it becomes a potential slightly higher than that due to the inflow of the charge. The amount of inflow of charge fluctuates according to the value of Vth. This is because the gate potential of the TFT 21 immediately before the end of the auto zero operation is substantially VDD−|Vth|. Accordingly, for example, the smaller the |Vth|, the higher this potential. On the other hand, at the time of the end of the auto zero operation, when the potential of the auto zero line AZL rises and the TFT 23 changes to the nonconductive state, the higher the source potential thereof, that is, the gate potential of the TFT 21, the more delayed the timing when the TFT 23 becomes nonconductive, therefore the larger the amount of charge that will flow into the gate of the TFT 21. As a result, the gate potential of the TFT 21 after the end of the auto zero operation is affected by the |Vth|, so the above Equation (3) and Equation (4) strictly do not stand and are affected by the Vth varying for each pixel.

Therefore, as a pixel circuit able to compensate for the threshold voltage Vth where variation of luminance is particularly liable to become a problem, it may be considered to use a threshold voltage correction type (offset cancellation type) pixel circuit. In this pixel circuit, in for example the circuit of FIG. 3, the connection point of the drain of the TFT 24 and the coupling capacitor C21 is precharged to a predetermined precharge potential for example for an auto zero period. In this case, the precharge potential line is arranged in the same direction (in the horizontal direction in FIG. 1) parallel to the scanning line. Generally this offset cancellation operation is carried out in synchronization with the scanning line. Here, where the number of pixels of the display is M×N, when using a layout providing the precharge potential line parallel to the scanning line direction as explained above, the number of pixels which are simultaneously offset cancelled by one precharge potential line in the scanning line is N, so N generally becomes several hundreds to thousands or more. Accordingly, as the resolution becomes larger, it becomes more difficult to hold the reference voltage Vpc at a stable potential. Further, when a gradient is formed in this potential between the left and right of the screen, there is the problem that a gradation is formed in the luminance of the displayed image.

It is desirable to provide a display device able to prevent crosstalk between pixels by relatively simple layout, able to prevent the occurrence of uneven luminance in the displayed image, able to stably and correctly supply a current of a desired value to the light emitting element of each pixel without regard to the variation of the threshold value of the active elements inside the pixels, and as a result able to display a high quality image.

It is further desirable to provide a pixel circuit and a display device able to stably and correctly supply a current of a desired value to the light emitting element of each pixel without regard to the variation of the threshold value of the active elements inside the pixels and able to stably hold the reference potential even when an offset cancellation function by the precharge potential line is provided and as a result able to display a high quality image.

According to a first aspect of an embodiment of the present invention, there is provided a display device having at least a plurality of pixel circuits, connected to signal lines to which data signals in accordance with luminance information are supplied, arranged in a matrix, wherein pixel circuits of odd number columns and even number columns adjacent sandwiching an axis in a column direction parallel to an arrangement direction of the signal lines therebetween have a mirror type circuit arrangement symmetric with respect to the axis of the column direction, and a line different from the signal lines is arranged between signal lines of adjacent pixel circuits.

Preferably, pixel circuit use signal lines which are adjacent to each other and do not employ a mirror type circuit arrangement are arranged so as to be adjacent to each other, and the line different from the signal lines is arranged between signal lines of adjacent pixel circuits not having the mirror type circuit arrangement relationship.

Preferably, the line different from the signal lines is a potential line held at a predetermined potential at least while data signals are being propagated at adjacent signal lines.

More preferably, power supply potential lines are arranged in the same direction as the arrangement direction of the signal lines, and two pixel circuits adjacent to each other and employing a mirror type circuit arrangement relationship share a power supply potential line.

Preferably, the two ends of a plurality of power supply potential lines are connected so as to become common and made the same potential.

Preferably, the device has a function of time-division of the writing of luminance data information from the signal lines into the pixel circuits by pixel circuits adjacent sandwiching an axis in the column direction parallel to the arrangement direction of the signal lines.

According to a second aspect of an embodiment of the present invention, there is provided a display device having at least a plurality of pixel circuits, connected to signal lines to which data signals in accordance with luminance information are supplied and connected at predetermined nodes to precharge potential lines, arranged in a matrix, wherein pixel circuits of odd number columns and even number columns adjacent sandwiching an axis in a column direction parallel to an arrangement direction of the signal lines therebetween have a mirror type circuit arrangement symmetric with respect to the axis of the column direction, and the precharge potential lines are arranged between signal lines of adjacent pixel circuits.

Preferably, pixel circuit use signal lines which are adjacent to each other and do not employ a mirror type circuit arrangement are arranged so as to be adjacent to each other, precharge potential lines are shared between pixel circuits not employing the mirror type circuit arrangement, and shared precharge potential lines are arranged between signal lines of adjacent pixel circuits not having the mirror type circuit arrangement relationship.

According to a third aspect of an embodiment of the present invention, there is provided a display device having a plurality of pixel circuits arranged in a matrix, signal lines arranged for each column of the matrix array of the pixel circuits and each supplied with at least a data signal in accordance with the luminance information, at least a first control line and a second control line arranged for each row of the matrix array of the pixel circuits, and precharge potential lines each of which is arranged between signal lines of adjacent pixel circuits, wherein pixel circuits of odd number columns and even number columns adjacent sandwiching the axis in the column direction parallel to the arrangement direction of the signal lines therebetween have a mirror type circuit arrangement symmetric with respect to the axis of the column direction, each of the pixel circuits has a first node, a second node, a drive transistor forming a current supply line between a first terminal and a second terminal and controlling a current flowing through the current supply line in accordance with the potential of the control terminal connected to the second node, a first switch connected between the signal line and the first node and controlled in its conduction by the first control line, a coupling capacitor connected between the first node and the second node connected to the control terminal of the drive transistor, and a second switch connected at one end to a corresponding precharge potential line, connected at the other end to the first node or the second node, and controlled in its conduction by the second control line.

According to a fourth aspect of an embodiment of the present invention, there is provided a display device having a plurality of pixel circuits arranged in a matrix, signal lines arranged for each column of the matrix array of the pixel circuits and each supplied with at least a data signal in accordance with the luminance information, at least a first control line and a second control line arranged for each row of the matrix array of the pixel circuits, and precharge potential lines each of which is arranged between signal lines of adjacent pixel circuits, wherein pixel circuits of odd number columns and even number columns adjacent sandwiching the axis in the column direction parallel to the arrangement direction of the signal lines therebetween have a mirror type circuit arrangement symmetric with respect to the axis of the column direction, each of the pixel circuits has a field effect transistor, a node, a first switch connected between the source of the field effect transistor and a first reference potential, a second switch connected between the source of the field effect transistor and the node, a third switch connected between the gate of the field effect transistor and the precharge potential and controlled in its conduction by the second control line, a fourth switch connected between the signal line and the node and controlled in its conduction by the first control line, and a coupling capacitor connected between the node and the gate of the field effect transistor, the electrooptic element connected between the drain of the field effect transistor and a second reference potential.

According to a fifth aspect of an embodiment of the present invention, there is provided a display device having a plurality of pixel circuits arranged in a matrix, signal line arranged for each column with respect to the matrix array of the pixel circuits and each supplied with at least a data signal in accordance with the luminance information, at least a first control line and a second control line arranged for each row of the matrix array of the pixel circuits, and precharge potential lines each of which is arranged between signal lines of adjacent pixel circuits, wherein pixel circuits of odd number columns and even number columns adjacent sandwiching the axis in the column direction parallel to the arrangement direction of the signal lines therebetween have a mirror type circuit arrangement symmetric with respect to the axis of the column direction, each of the pixel circuits has a field effect transistor, an electrooptic element, a node, a first switch connected between the source of the field effect transistor and the electrooptic element, a second switch connected between the source of the field effect transistor and the node, a third switch connected between the gate of the field effect transistor and the precharge potential and controlled in its conduction by the second control line, a fourth switch connected between the signal line and the node and controlled in its conduction by the first control line, and a coupling capacitor connected between the node and the gate of the field effect transistor, the drain of the field effect transistor being connected to a first reference potential, and the electrooptic element being connected between the first switch and a second reference potential.

According to a sixth aspect of an embodiment of the present invention, there is provided a display device having a plurality of pixel circuits arranged in a matrix, signal lines arranged for each column with respect to the matrix array of the pixel circuits and each supplied with at least a data signal in accordance with the luminance information, at least a first control line and a second control line arranged for each row of the matrix array of the pixel circuits, and precharge potential lines each of which is arranged between signal lines of adjacent pixel circuits, wherein pixel circuits of odd number columns and even number columns adjacent sandwiching the axis in the column direction parallel to the arrangement direction of the signal lines therebetween have a mirror type circuit arrangement symmetric with respect to the axis of the column direction, each of the pixel circuits has a field effect transistor, an electrooptic element, a node, a first switch connected between the drain of the field effect transistor and the electrooptic element, a second switch connected between the drain and the gate of the field effect transistor, a third switch connected between the node and the precharge potential and controlled in its conduction by the second control line, a fourth switch connected between the signal line and the node and controlled in its conduction by the first control line, and a coupling capacitor connected between the node and the gate of the field effect transistor, the source of the field effect transistor being connected to the first reference potential, and the electrooptic element being connected between the first switch and the second reference potential.

Preferably, pixel circuit use signal lines which are adjacent to each other and do not employ a mirror type circuit arrangement are arranged so as to be adjacent to each other, precharge potential lines are shared between pixel circuits not employing the mirror type circuit arrangement, shared precharge potential lines are arranged between signal lines of adjacent pixel circuits not having the mirror type circuit arrangement relationship, power supply potential lines are arranged in the same direction as the arrangement direction of the signal lines, and two pixel circuits adjacent to each other and employing the mirror type circuit arrangement relationship share the power supply potential lines.

More preferably, the two ends of a plurality of power supply potential lines are connected so as to become common and made the same potential.

According to a seventh aspect of an embodiment of the present invention, there is provided a pixel circuit for driving an electrooptic element changing in its luminance according to a flowing current, having a signal line to which at least a data signal in accordance with luminance information is supplied, at least a first control line and second control line, a predetermined precharge potential line, a first node, a second node, a drive transistor for forming a current supply line between a first terminal and a second terminal and controlling the current flowing in the current supply line in accordance with the potential of the control terminal connected to the second node, a first switch connected between the signal line and the first node and controlled in its conduction by the first control line, a coupling capacitor connected between the first node and the second node connected to the control terminal of the drive transistor, and a second switch connected at one end to the precharge potential line, connected at the other end to the first node or the second node, and controlled in its conduction by the second control line, wherein the precharge potential line is arranged in the same direction parallel to the signal line.

According to an eighth aspect of an embodiment of the present invention, there is provided a pixel circuit for driving an electrooptic element changing in its luminance according to a flowing current, having a signal line to which at least a data signal in accordance with luminance information is supplied, first and second reference potentials, a predetermined precharge potential, a field effect transistor, a node, a first switch connected between the source of the field effect transistor and the first reference potential, a second switch connected between the source of the field effect transistor and the node, a third switch connected between the gate of the field effect transistor and the precharge potential, a fourth switch connected between the signal line and the node and controlled in its conduction by the first control line, and a coupling capacitor connected between the node and the gate of the field effect transistor, the electrooptic element being connected between the drain of the field effect transistor and the second reference potential, and the precharge potential line being arranged in the same direction so as to be parallel to the signal line.

According to a ninth aspect of an embodiment of the present invention, there is provided a pixel circuit for driving an electrooptic element changing in its luminance according to a flowing current, having a signal line to which at least a data signal in accordance with luminance information is supplied, first and second reference potentials, a predetermined precharge potential, a field effect transistor, a node, a first switch connected between the source of the field effect transistor and the electrooptic element, a second switch connected between the source of the field effect transistor and the node, a third switch connected between the gate of the field effect transistor and the precharge potential, a fourth switch connected between the signal line and the node and controlled in its conduction by the first control line, and a coupling capacitor connected between the node and the gate of the field effect transistor, the drain of the field effect transistor being connected to the first reference potential, the electrooptic element being connected between the first switch and the second reference potential, and the precharge potential line being arranged in the same direction so as to be parallel to the signal line.

According to a 10th aspect of an embodiment of the present invention, there is provided a pixel circuit for driving an electrooptic element changing in its luminance according to a flowing current, having at least a signal line to which a data signal in accordance with luminance information is supplied, at least a first control line, first and second reference potentials, a predetermined precharge potential, a field effect transistor, a node, a first switch connected between the drain of the field effect transistor and the electrooptic element, a second switch connected between the drain and gate of the field effect transistor, a third switch connected between the node and the precharge potential, a fourth switch connected between the signal line and the node and controlled in its conduction by the first control line, and a coupling capacitor connected between the node and the gate of the field effect transistor, the source of the field effect transistor being connected to the first reference potential, the electrooptic element being connected between the first switch and the second reference potential, and the precharge potential line being arranged in the same direction so as to be parallel to the signal line.

According to an 11th aspect of an embodiment of the present invention, there is provided a display device comprised of a plurality of pixel circuits arranged in a matrix, signal lines arranged for each column of the matrix array of the pixel circuits and each supplied with at least a data signal in accordance with luminance information, at least a first control line arranged for each row of the matrix array of the pixel circuits, and predetermined precharge potential lines arranged in the same direction as the signal lines with respect to the matrix array of the pixel circuits, wherein each of the pixel circuits has an electrooptic element, a first node, a second node, a drive transistor for forming a current supply line between a first terminal and a second terminal and controlling the current flowing in the current supply line in accordance with the potential of the control terminal connected to the second node, a first switch connected between the signal line and the first node and controlled in its conduction by the first control line, a coupling capacitor connected between the first node and the second node connected to the control terminal of the drive transistor, and a second switch connected at one end to a corresponding precharge potential line, connected at the other end to the first node or the second node, and controlled in its conduction by the second control line.

According to a 12th aspect of an embodiment of the present invention, there is provided a display device comprised of a plurality of pixel circuits arranged in a matrix, signal lines arranged for each column with respect to the matrix array of the pixel circuits and each supplied with at least a data signal in accordance with luminance information, at least a first control line arranged for each row of the matrix array of the pixel circuits, predetermined precharge potential lines arranged in the same direction as the signal lines with respect to the matrix array of the pixel circuits, and first and second reference potentials, wherein each of the pixel circuits has a field effect transistor, an electrooptic element, a node, a first switch connected between the source of the field effect transistor and the first reference potential, a second switch connected between the source of the field effect transistor and the node, a third switch connected between the gate of the field effect transistor and the precharge potential, a fourth switch connected between the signal line and the node and controlled in its conduction by the first control line, and a coupling capacitor connected between the node and the gate of the field effect transistor, the electrooptic element being connected between the drain of the field effect transistor and a second reference potential.

According to a 13th aspect of an embodiment of the present invention, there is provided a display device comprised of a plurality of pixel circuits arranged in a matrix, signal lines arranged for each column of the matrix array of the pixel circuits and each supplied with a data signal in accordance with luminance information, at least a first control line arranged for each row of the matrix array of the pixel circuits, predetermined precharge potential lines arranged in the same direction as the signal lines with respect to the matrix array of the pixel circuits, and first and second reference potentials, wherein each of the pixel circuits has a field effect transistor, an electrooptic element, a node, a first switch connected between the source of the field effect transistor and the electrooptic element, a second switch connected between the source of the field effect transistor and the node, a third switch connected between the gate of the field effect transistor and the precharge potential, a fourth switch connected between the signal line and the node and controlled in its conduction by the first control line, and a coupling capacitor connected between the node and the gate of the field effect transistor, the drain of the field effect transistor being connected to a first reference potential, and the electrooptic element being connected between the first switch and a second reference potential.

According to a 14th aspect of an embodiment of the present invention, there is provided a display device comprised of a plurality of pixel circuits arranged in a matrix, signal lines arranged for each column of the matrix array of the pixel circuits and each supplied with at least a data signal in accordance with luminance information, at least a first control line arranged for each row of the matrix array of the pixel circuits, predetermined precharge potential lines arranged in the same direction as the signal lines with respect to the matrix array of the pixel circuits, and first and second reference potentials, wherein each of the pixel circuits has a field effect transistor, an electrooptic element, a node, a first switch connected between the source of the field effect transistor and the electrooptic element, a second switch connected between the source of the field effect transistor and the node, a third switch connected between the node and the precharge potential, a fourth switch connected between the signal line and the node and controlled in its conduction by the first control line, and a coupling capacitor connected between the node and the gate of the field effect transistor, the source of the field effect transistor being connected to the first reference potential, and the electrooptic element being connected between the first switch and the second reference potential.

According to the embodiment of the present invention, for example fixed potential lines are arranged in the same direction so as to be parallel to the signal lines. Due to this, adjacent signal lines are shielded by the fixed potential lines, electromagnetic coupling between adjacent signal lines is blocked, and crosstalk does not occur. As a result, the correct luminance data is written.

Further, the precharge potential lines are arranged in the same direction so as to be parallel to the signal lines. In this case, the number of pixels which are connected to one of the precharge potential lines arranged in the same direction as the signal lines and simultaneously offset cancelled is for example K. Usually, K is the offset cancellation period and a time necessary for a sufficient offset. It is usually 1 to several tens or less or small in comparison with the number of pixels which are simultaneously cancelled. Further, even when the resolution of the panel rises, K does not change. Accordingly, it becomes easy to hold the precharge potential at a stable potential. Further, it is also possible to share precharge lines of L pixels adjacent in the parallel direction to the scanning lines. In this case, the number of pixels connected to one of the precharge lines parallel to the signal lines and simultaneously offset cancelled is K×L. At this time, for L, a suitable value within a range where it is possible to hold the precharge line at the stable potential may be selected.

Further, the first switch, the second switch, and the third switch are made the conductive state by for example a predetermined control line. At this time, the control terminal of the drive transistor, for example, the gate, becomes the precharge potential Vpc by the third switch, and an input side potential (node potential) of the coupling capacitor rises to the first reference potential (power supply potential $V_{cc}$) or near it since the first and second switches are in the conductive state. Then, the first switch is made the nonconductive state by the predetermined control line. By this, the current flowing in the drive transistor is shut off, therefore the potential of the second terminal (for example drain) of the drive transistor falls, but the drive transistor becomes the nonconductive state at a point of time when the potential falls to Vpc+|Vth|, and the potential is stabilized. At this time, the input side potential (node potential) of the capacitor is still Vpc+|Vth| since the second switch is in the conductive state. Here, |Vth| is an absolute value of the threshold value of the drive transistor. Next, the second and third switches are made the nonconductive state by the predetermined control line. Alternatively, after making the second switch the nonconductive state, the third switch is made the nonconductive state by the predetermined control line. The potential of the input side node of the capacitor is Vpc+|Vth|, and the gate potential of the drive transistor is Vpc. Namely, the potential difference between terminals of the capacitor becomes |Vth|. Then, the fourth switch is made the conductive state, and the potential Vdata in accordance with the luminance data is given from the signal line to the input side node of the capacitor. The potential difference between terminals of the capacitor is held at |Vth| as it is, therefore, the gate potential of the drive transistor becomes Vdata−|Vth|. Next, when the fourth switch is made the nonconductive state, and the first switch is made the conductive state by the predetermined control line, the current flows in the drive transistor and the electrooptic element to start the light emission.

BRIEF DESCRIPTION OF THE DRAWINGS

These and other objects and features of the present invention will become clearer from the following description of the preferred embodiments given with reference to the accompanying drawings, wherein:

FIGS. 7A to 7E are diagrams for explaining a write operation of luminance data;

DESCRIPTION OF THE PREFERRED EMBODIMENTS

Below, embodiments of the present invention will be described with reference to the accompanying drawings.

First Embodiment

Figure 9:
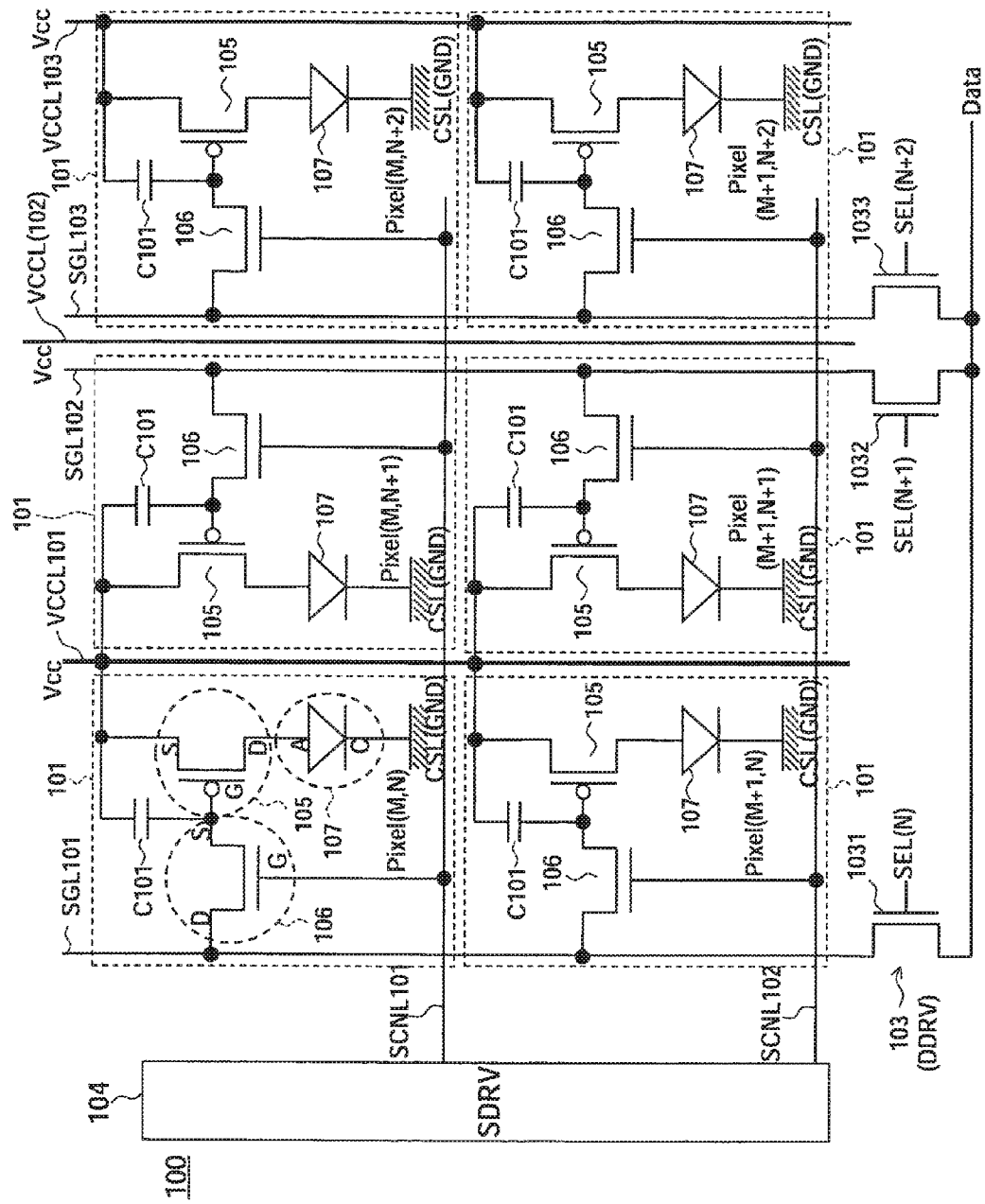
FIG. 9 is a circuit diagram of an active matrix type organic EL display (display device) according to a first embodiment of the present invention.

FIG. 9 is a circuit diagram of an active matrix type organic EL display (display device) according to a first embodiment of the present invention. Further, FIG. 10 is a diagram of a layout of power supply lines of the active matrix type organic EL display according to the first embodiment.

The present organic EL display 100 has, as shown in FIG. 9, a pixel array 102 including pixel circuits 101 arranged in an m×n matrix, a data driver (DDRV) 103, and a scan driver (SDRV) 104. n number of columns' worth of signal lines SGL1 to SGLn driven by the data driver (DDRV) 103 are arranged for each pixel column of the matrix array of the pixel circuits 101, while m number of rows' worth of scanning lines SCNL101 to SCNL10m selectively driven by the data driver (SDRV) 104 are arranged for each pixel row.

Figure 10:
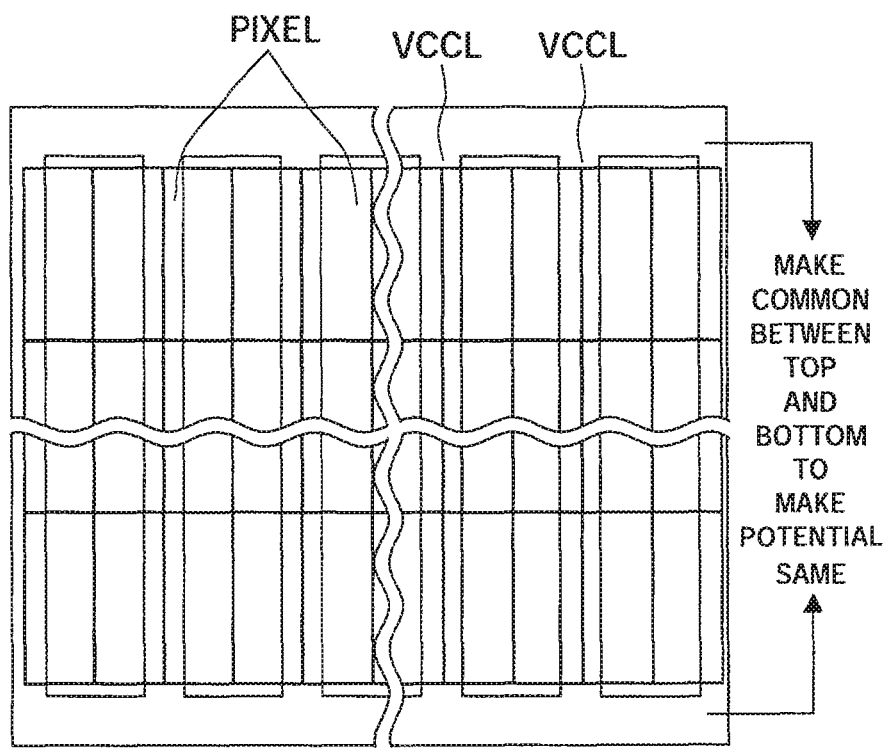
FIG. 10 is a diagram of a layout of power supply lines of the active matrix type organic EL display according to the first embodiment.

Further, in the present embodiment, the power supply potential lines VCCL, as shown in FIG. 10, are made common at the top and bottom of the display region constituted by the pixel array 102 in the figure, that is, the two ends of the plurality of power supply potential lines VCCL101 to VCCL10n are connected in common to make the potentials the same in order to prevent uneven luminance due to the potential difference in the length direction occurring between the top and bottom of the power supply potential lines VCCL in the figure.

Further, in the present embodiment, pairs of adjacent pixel circuits in the same rows between the pixel circuits arranged at the odd number columns and the pixel circuits arranged at the even number columns are arranged symmetric with respect to an axis in the column direction, that is, a so-called mirror type circuit arrangement is used. These adjacent pixel circuits share power supply potential lines VCCL. The power supply potential lines are formed thicker than usual. Further, the pixel circuit signal lines in the even number columns and the pixel circuit signal lines in the odd number columns are arranged adjacently not in a mirror type circuit arrangement. Further, fixed potential lines VCCL are arranged between the pixel circuits in the even number columns and the pixel circuits in the odd number columns not in a mirror type circuit arrangement to suppress occurrence of crosstalk between signal lines. Accordingly, one power supply potential line VCCL is arranged for each odd column (for each two pixels).

Note that, in the present pixel array 102, the pixel circuits 101 are arranged in an m×n matrix, but FIG. 9 shows an example in which they are arranged in a 2 (=m)×3(=n) matrix for simplification of the figure. Further, in FIG. 9, the 2×3 pixel circuits are also labeled as the "Pixel (M,N)", "Pixel (M,N+1)", "Pixel (M,N+2)", "Pixel (M+1,N)", "Pixel (M+1,N+1)", and "Pixel (M+1,N+2)".

Next, an explanation will be given of the specific configuration of a pixel circuit 101.

The pixel circuit 101 has, as shown in FIG. 9, one p-channel TFT 105, one n-channel TFT 106, an organic EL element 107, and a capacitor C101.

In the pixel circuit "Pixel (M,N)" arranged at the first row and the first column of FIG. 9, the source of the TFT 105 used as the drive transistor is connected to the power supply potential line VCCL101 arranged at the first column, the drain is connected to the anode side of the organic EL element 107, and the cathode of the light emitting element 107 is connected to the cathode line CSL of a predetermined potential (for example, the ground potential). A first electrode of the capacitor C101 is connected to the gate of the TFT 105 (source of the TFT 106), and a second electrode is connected to the power supply potential line VCCL101 arranged at the first column. The source of the TFT 106 is connected to the gate of the TFT 105, the drain is connected to the signal line SGL101 arranged at the first column, and the gate is connected to the scanning line SCNL101 arranged at the first row.

In the pixel circuit "Pixel (M,N+1)" arranged at the first row and second column of FIG. 9, the source of the TFT 105 used as the drive transistor is connected to the power supply potential line VCCL101 arranged at the first column, the drain is connected to the anode side of the organic EL element 107, and the cathode of the light emitting element 107 is connected to the cathode line CSL of a predetermined potential (for example, the ground potential). A first electrode of the capacitor C101 is connected to the gate of the TFT 105 (source of the TFT 106), and a second electrode is connected to the power supply potential line VCCL101 arranged at the first column. The source of the TFT 106 is connected to the gate of the TFT 105, the drain is connected to the signal line SGL102 arranged at the second column, and the gate is connected to the scanning line SCNL101 arranged at the first row.

In the pixel circuit "Pixel (M,N+2)" arranged at the first row and third column of FIG. 9, the source of the TFT 105 used as the drive transistor is connected to the power supply potential line VCCL103 arranged at the third column, the drain is connected to the anode side of the organic EL element 107, and the cathode of the light emitting element 107 is connected to the cathode line CSL of a predetermined potential (for example, the ground potential). A first electrode of the capacitor C101 is connected to the gate of the TFT 105 (source of the TFT 106), and a second electrode is connected to the power supply potential line VCCL103 arranged at the third column. The source of the TFT 106 is connected to the gate of the TFT 105, the drain is connected to the signal line SGL103 arranged at the third column, and the gate is connected to the scanning line SCNL101 arranged at the first row.

In the pixel circuit "Pixel (M+1,N)" arranged at the second row and the first column of FIG. 9, the source of the TFT 105 used as the drive transistor is connected to the power supply potential line VCCL101 arranged at the first column, the drain is connected to the anode side of the organic EL element 107, and the cathode of the light emitting element 107 is connected to the cathode line CSL of a predetermined potential (for example, the ground potential). A first electrode of the capacitor C101 is connected to the gate of the TFT 105 (source of the TFT 106), and a second electrode is connected to the power supply potential line VCCL101 arranged at the first column. The source of the TFT 106 is connected to the gate of the TFT 105, the drain is connected to the signal line SGL101 arranged at the first column, and the gate is connected to the scanning line SCNL102 arranged at the second row.

In the pixel circuit "Pixel (M+1,N+1)" arranged at the second row and the second column of FIG. 9, the source of the TFT 105 used as the drive transistor is connected to the power supply potential line VCCL101 arranged at the first column, the drain is connected to the anode side of the organic EL element 107, and the cathode of the light emitting element 107 is connected to the cathode line CSL of a predetermined potential (for example, the ground potential). A first electrode of the capacitor C101 is connected to the gate of the TFT 105 (source of the TFT 106), and a second electrode is connected to the power supply potential line VCCL101 arranged at the first column. The source of the TFT 106 is connected to the gate of the TFT 105, the drain is connected to the signal line SGL102 arranged at the second column, and the gate is connected to the scanning line SCNL102 arranged at the second row.

In the pixel circuit "Pixel (M+1,N+2)" arranged at the second row and third column of FIG. 9, the source of the TFT 105 used as the drive transistor is connected to the power supply potential line VCCL103 arranged at the third column, the drain is connected to the anode side of the organic EL element 107, and the cathode of the light emitting element 107 is connected to the cathode line CSL of a predetermined potential (for example, the ground potential). A first electrode of the capacitor C101 is connected to the gate of the TFT 105 (source of the TFT 106), and a second electrode is connected to the power supply potential line VCCL103 arranged at the third column. The source of the TFT 106 is connected to the gate of the TFT 105, the drain is connected to the signal line SGL103 arranged at the third column, and the gate is connected to the scanning line SCNL102 arranged at the second row.

Next, an explanation will be given of the operation of the pixel circuit 101 by taking as an example the "Pixel (M,N)" of FIG. 9.

In a pixel circuit for writing the luminance data, the pixel row including the pixel circuit is selected by the scan driver 104 via the scanning line SCNL101, whereby the TFT 106 of the pixel circuit of that row (the first row in the present example) turns ON. At this time, the luminance data is supplied from the data driver 103 via the signal line SGL101 in the form of voltage and written into the capacitor C101 for holding the data voltage through the TFT 106. The luminance data written in the capacitor C101 is held over a 1 field period. This held data voltage is applied to the gate of the TFT 105. Due to this, the TFT 105 drives the organic EL element 107 by a current according to the held data. At this time, gradations of the organic EL element 107 are expressed by modulating the voltage Vdata (<0) between the gate and the source of the TFT 105 held by the capacitor C101.

Then, for example, a select switch 1032 of the data driver 103 turns ON and the data is transferred to the signal line SGL102, then the select switch 1032 turns OFF, a select switch 1033 turns ON, and the data is transferred to the signal line SGL103. When writing the luminance data into the adjacent pixel circuits in a time division manner in this way, since there is the power supply potential line VCC(102)

of a fixed potential between the signal line SGL102 and the signal line SGL103, electromagnetic coupling is blocked and crosstalk does not occur. For this reason, it becomes possible to write the correct luminance data.

According to the first embodiment, there are the advantages that crosstalk between pixels can be prevented with a relatively simple layout without three-dimensional electromagnetic shielding and it becomes possible to correctly write the luminance data.

Further, in the first embodiment, the power supply potential lines VCCL are made common at the top and bottom of the display region constituted by the pixel array 102 in the figure, that is, the two ends of the plurality of power supply potential lines VCCL101 to VCCL10n are connected in common to make the potentials the same. Accordingly, it is possible to prevent uneven luminance due to the potential difference in the length direction occurring in the figure of the power supply potential line VCCL.

Note that the pixel circuit 101 of FIG. 9 is an example. The present embodiment is not limited to this. For example, as mentioned above, it is clear that the TFT 106 is only a switch, so it is also possible to configure it by a p-channel TFT or other switch element.

Second Embodiment

Figure 11:
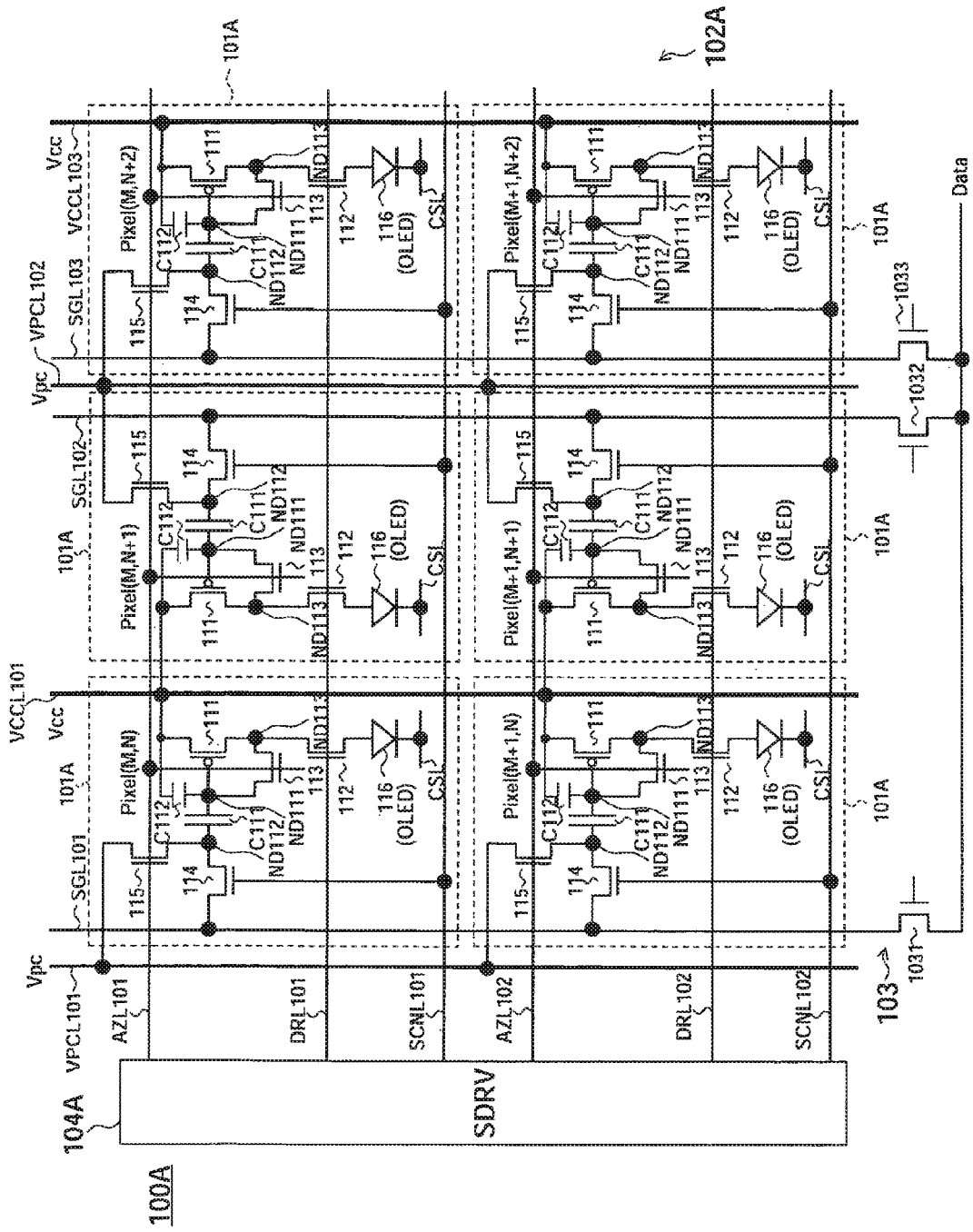
FIG. 11 is a circuit diagram of an active matrix type organic EL display (display device) according to a second embodiment of the present invention.

FIG. 11 is a circuit diagram of an active matrix type organic EL display device (display device) according to a second embodiment of the present invention. Further, FIG. 12 is a diagram of the layout of the power supply lines of an active matrix type organic EL display device according to the second embodiment.

The organic EL display 100A has, as shown in FIG. 11, a pixel array 102A including pixel circuits 101A arranged in an m×n matrix, a data driver (DDRV) 103, and a scan driver (SDRV) 104A. Further, the n number of columns' worth of the signal lines SGL1 to SGLn driven by the data driver (DDRV) 103 are arranged for each pixel column of the matrix array of the pixel circuits 101A, and m number of rows' worth of the scanning lines SCNL101 to SCNL10m, drive lines DRL101 to DRL10m, and auto zero lines AZL101 to AZL10m selectively driven by the scan driver (SDRV) 104A are arranged for each pixel row.

Further, in the present embodiment, n number of columns' worth of power supply potential lines VCCL101 to VCCL10n for supplying the power supply voltage Vcc and n number of columns' worth of precharge potential lines VPCL101 to VPCL10n for supplying the reference voltage Vpc for offset cancellation are arranged for each pixel column in the same direction so as to be parallel to the signal lines SGL101 to SGL10n.

Figure 12:
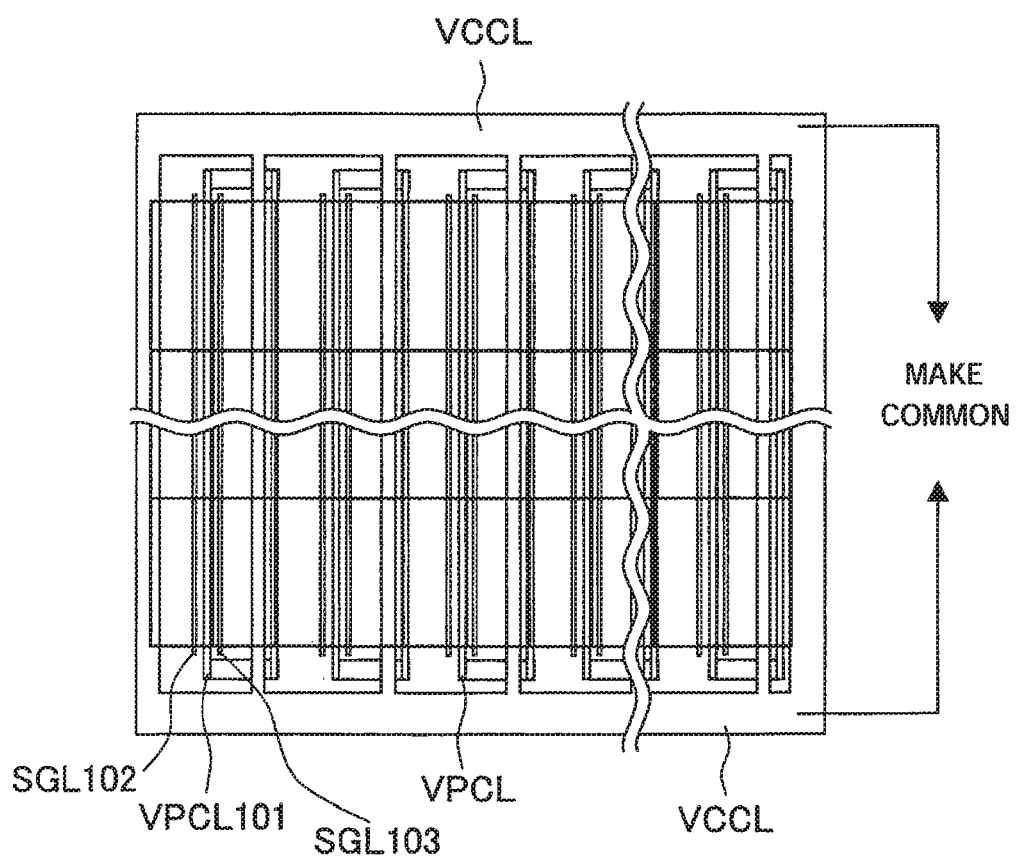
FIG. 12 is a diagram of a layout of power supply lines of the active matrix type organic EL display according to the second embodiment.

Further, in the present embodiment, the power supply potential lines VCCL, as shown in FIG. 12, are made common at the top and bottom of the display region constituted by the pixel array 102A in the figure, that is, the two ends of the plurality of power supply potential lines VCCL101 to VCCL10n are connected in common to make the potentials the same in order to prevent uneven luminance due to the potential difference in the length direction occurring between the top and bottom of the power supply potential lines VCCL in the figure.

Further, in the present embodiment, pairs of adjacent pixel circuits in the same rows between the pixel circuits arranged at the odd number columns and the pixel circuits arranged at the even number columns are arranged symmetric with respect to an axis in the column direction, that is, a so-called mirror type circuit arrangement is used. These adjacent pixel circuits share power supply potential lines VCCL. The power supply potential lines are formed thicker than usual.

Further, the pixel circuit signal lines in the even number columns and the pixel circuit signal lines in the odd number columns are arranged adjacently not in a mirror type circuit arrangement. Further, precharge potential lines VPCL are arranged between the pixel circuits in the even number columns and the pixel circuits in the odd number columns not in a mirror type circuit arrangement to suppress occurrence of crosstalk between signal lines. Accordingly, one power supply potential line VCCL is arranged for each odd column (for each two pixels).

Note that, in the present pixel array 102A, the pixel circuits 101A are arranged in an m×n matrix, but FIG. 11 shows an example in which they are arranged in a 2(=m)×3(=n) matrix for simplification of the figure. Further, in FIG. 11, the 2×3 pixel circuits are also indicated as the "Pixel (M,N)", "Pixel (M,N+1)", "Pixel (M,N+2)", "Pixel (M+1,N)", "Pixel (M+1,N+1)", and "Pixel (M+1,N+2)".

Next, an explanation will be given of the specific configuration of each pixel circuit 101A.

The pixel circuit 101A has, as shown in FIG. 11, one p-channel TFT 111, four n-channel TFTs 112 to 115, an organic EL element 116, capacitors C111 and C112, and nodes ND111 to ND113.

In the pixel circuit "Pixel (M,N)" arranged at the first row and first column of FIG. 11, the source of the TFT 111 used as the drive transistor is connected to the power supply potential line VCCL101 arranged at the first column, the drain is connected to the node ND113, and the gate is connected to the node ND111. The drain of the TFT 112 is connected to the node ND113 (drain of the TFT 111), the source is connected to the anode side of the organic EL element 116, the gate is connected to the drive line DRL101 arranged at the first row, and the cathode of the light emitting element 116 is connected to the cathode line CSL of a predetermined potential (for example, the ground potential). The source of the TFT 113 is connected to the node ND113 (drain of the TFT 111), the drain is connected to the node ND111 (gate of the TFT 111), and the gate is connected to the auto zero line AZL101 arranged at the first row. A first electrode of the capacitor C111 is connected to the node ND111, and a second electrode is connected to the node ND112. Further, a first electrode of the capacitor C112 is connected to the node ND111, and a second electrode is connected to the power supply potential line VCCL101 arranged at the first column. The source of the TFT 114 is connected to the node ND112, the drain is connected to the signal line SGL101 arranged at the first column, and the gate is connected to the scanning line SCNL101 arranged at the first row. The source of the TFT 115 is connected to the node ND112, and the drain is connected to the precharge potential line VPCL101 arranged at the first column.

In the pixel circuit "Pixel (M,N+1)" arranged at the first row and second column of FIG. 11, the source of the TFT 111 used as the drive transistor is connected to the power supply potential line VCCL101 arranged at the first column, the drain is connected to the node ND113, and the gate is connected to the node ND111. The drain of the TFT 112 is connected to the node ND113 (drain of the TFT 111), the source is connected to the anode side of the organic EL element 116, the gate is connected to the drive line DRL101 arranged at the first row, and the cathode of the light emitting element 116 is connected to the cathode line CSL of a predetermined potential (for example, the ground potential). The source of the TFT 113 is connected to the node ND113 (drain of the TFT 111), the drain is connected to the node ND111 (gate of the TFT 111), and the gate is connected to the auto zero line AZL101 arranged at the first row. A first electrode of the capacitor C111 is connected to the node ND111, and a second electrode is connected to the node ND112. Further, a first electrode of the capacitor C112 is connected to the node ND111, and a second electrode is connected to the power supply potential line VCCL101 arranged at the first column. The source of the TFT 114 is connected to the node ND112, the drain is connected to the signal line SGL102 arranged at the second column, and the gate is connected to the scanning line SCNL101 arranged at the first row. The source of the TFT 115 is connected to the node ND112, and the drain is connected to the precharge potential line VPCL102 arranged at the second column.

In the pixel circuit "Pixel (M,N+2)" arranged at the first row and third column of FIG. 11, the source of the TFT 111 used as the drive transistor is connected to the power supply potential line VCCL103 arranged at the third column, the drain is connected to the node ND113, and the gate is connected to the node ND111. The drain of the TFT 112 is connected to the node ND113 (drain of the TFT 111), the source is connected to the anode side of the organic EL element 116, the gate is connected to the drive line DRL101 arranged at the first row, and the cathode of the light emitting element 116 is connected to the cathode line CSL of a predetermined potential (for example, the ground potential). The source of the TFT 113 is connected to the node ND113 (drain of the TFT 111), the drain is connected to the node ND111 (gate of the TFT 111), and the gate is connected to the auto zero line AZL101 arranged at the first row. A first electrode of the capacitor C111 is connected to the node ND111, and a second electrode is connected to the node ND112. Further, a first electrode of the capacitor C112 is connected to the node ND111, and a second electrode is connected to the power supply potential line VCCL103 arranged at the third column. The source of the TFT 114 is connected to the node ND112, the drain is connected to the signal line SGL103 arranged at the third column, and the gate is connected to the scanning line SCNL101 arranged at the first row. The source of the TFT 115 is connected to the node ND112, and the drain is connected to the precharge potential line VPCL102 arranged at the second column.

In the pixel circuit "Pixel (M+1,N)" arranged at the second row and first column of FIG. 11, the source of the TFT 111 used as the drive transistor is connected to the power supply potential line VCCL101 arranged at the first column, the drain is connected to the node ND113, and the gate is connected to the node ND111. The drain of the TFT 112 is connected to the node ND113 (drain of the TFT 111), the source is connected to the anode side of the organic EL element 116, the gate is connected to the drive line DRL102 arranged at the second row, and the cathode of the light emitting element 116 is connected to the cathode line CSL of a predetermined potential (for example, the ground potential). The source of the TFT 113 is connected to the node ND113 (drain of the TFT 111), the drain is connected to the node ND111 (gate of the TFT 111), and the gate is connected to the auto zero line AZL102 arranged at the second row. A first electrode of the capacitor C111 is connected to the node ND111, and a second electrode is connected to the node ND112. Further, a first electrode of the capacitor C112 is connected to the node ND111, and a second electrode is connected to the power supply potential line VCCL101 arranged at the first column. The source of the TFT 114 is connected to the node ND112, the drain is connected to the signal line SGL101 arranged at the first column, and the gate is connected to the scanning line SCNL102 arranged at the second row. The source of the TFT 115 is connected to the node ND112, and the drain is connected to the precharge potential line VPCL101 arranged at the first column.

In the pixel circuit "Pixel (M+1,N+1)" arranged at the second row and second column of FIG. 11, the source of the TFT 111 used as the drive transistor is connected to the power supply potential line VCCL101 arranged at the first column, the drain is connected to the node ND113, and the gate is connected to the node ND111. The drain of the TFT 112 is connected to the node ND113 (drain of the TFT 111), the source is connected to the anode side of the organic EL element 116, the gate is connected to the drive line DRL102 arranged at the second row, and the cathode of the light emitting element 116 is connected to the cathode line CSL of a predetermined potential (for example, the ground potential). The source of the TFT 113 is connected to the node ND113 (drain of the TFT 111), the drain is connected to the node ND112 (gate of the TFT 111), and the gate is connected to the auto zero line AZL102 arranged at the second row. A first electrode of the capacitor C111 is connected to the node ND111, and a second electrode is connected to the node ND112. Further, a first electrode of the capacitor C112 is connected to the node ND111, and a second electrode is connected to the power supply potential line VCCL101 arranged at the first column. The source of the TFT 114 is connected to the node ND112, the drain is connected to the signal line SGL102 arranged at the second column, and the gate is connected to the scanning line SCNL102 arranged at the second row. The source of the TFT 115 is connected to the node ND112, and the drain is connected to the precharge potential line VPCL102 arranged at the second column.

In the pixel circuit "Pixel (M+1,N+2)" arranged at the second row and third column of FIG. 11, the source of the TFT 111 used as the drive transistor is connected to the power supply potential line VCCL103 arranged at the third column, the drain is connected to the node ND113, and the gate is connected to the node ND111. The drain of the TFT 112 is connected to the node ND113 (drain of the TFT 111), the source is connected to the anode side of the organic EL element 116, the gate is connected to the drive line DRL102 arranged at the second row, and the cathode of the light emitting element 116 is connected to the cathode line CSL of a predetermined potential (for example, the ground potential). The source of the TFT 113 is connected to the node ND113 (drain of the TFT 111), the drain is connected to the node ND112 (gate of the TFT 111), and the gate is connected to the auto zero line AZL102 arranged at the second row. A first electrode of the capacitor C111 is connected to the node ND111, and a second electrode is connected to the node ND112. Further, a first electrode of the capacitor C112 is connected to the node ND111, and a second electrode is connected to the power supply potential line VCCL103 arranged at the third column. The source of the TFT 114 is connected to the node ND112, the drain is connected to the signal line SGL103 arranged at the third column, and the gate is connected to the scanning line SCNL102 arranged at the second row. The source of the TFT 115 is connected to the node ND112, and the drain is connected to the precharge potential line VPCL102 arranged at the second column.

Next, an explanation will be given of the operation of the pixel circuit 101A by taking as an example the "Pixel (M,N)" of FIG. 11.

The drive line DRL101 and the auto zero line AZL101 are made the high level, and the TFT 112, TFT 113, and TFT 115 are made the conductive state. At this time, the TFT 111 is connected to the light emitting element (OLED) 116 in the diode-connected state, therefore a constant current Iref flows in the TFT 111. Further, the fixed reference voltage Vpc supplied to the precharge potential line VPCL101 is supplied to the node ND112 of one end (second electrode side) of the coupling capacitor C111 through the TFT 115. Then, a voltage the same as the potential between the gate and the source when the current Iref flows in the TFT 111 used as the drive transistor is produced at the two ends of the coupling capacitor C111. This potential Vref is represented by the following equation defining the gate side of the TFT 111 used as the drive transistor as the plus direction.

$$Iref=\beta(Vref-Vth)^2 \quad (5)$$

Here, β is a proportional coefficient of the drive transistor (∝ mobility of the drive transistor), and Vth is the threshold voltage of the drive transistor. Namely, the potential Vref between the gate and the source of the TFT 111 used as the drive transistor becomes as follows. Note that Iref may be equal to 0 as well.

$$Vref=Vth+(Iref/\beta)^{1/2} \quad (6)$$

Next, the drive line DRL101 is made the low level, and the TFT 112 is made nonconductive. At this time, the TFT 114 is made the conductive state when the scanning line SCNL101 is at the high level, and the reference potential Vref is given to the signal line SGL101. The current flowing in the TFT 111 is shut off, therefore the gate potential Vg of the TFT 111 rises, but at a point of time when the potential rises up to Vcc−|Vth|, the TFT 111 becomes the nonconductive state and the potential is stabilized. Namely, the auto zero operation is carried out.

The auto zero line AZL101 is made the low level to make the TFT 113 the nonconductive state, and the data voltage Vdata is written into the other end side (node ND111 side) of the coupling capacitor C111 through the signal line SGL101. Accordingly, the gate-source potential of the drive transistor at this time is expressed as follows:

$$Vgs=Vdata+Vref-Vsource$$

$$=Vdata+Vth+(Iref/\beta)^{1/2}-Vsource \quad (7)$$

Accordingly, the current Ids flowing in the drive transistor becomes as follows.

$$Ids=\beta(Vdata+(Iref/\beta)^{1/2}-Vsource)^2 \quad (8)$$

Namely, the current Ids flowing in the drive transistor does not depend upon the threshold voltage Vth. Namely, the threshold voltage is corrected.

Note that, in order to start the light emission by the light emitting element 116, after fetching the data voltage, the operation of making the scanning line SCNL101 the low level to make the TFT 114 the nonconductive state and making the drive line DRL101 the high level to make the TFT 112 the conductive state is carried out.

Here, the timing of the offset cancellation will be considered. In the present embodiment, the precharge potential lines VPCL are arranged parallel to the signal lines SGL. At this time, the number of pixels connected to one of the precharge potential lines VPCL parallel to the signal lines SGL and simultaneously offset cancelled is K. Usually, K is the offset cancellation period and the time necessary for the sufficient offset. It is usually 1 to several tens or less and small in comparison with the number of pixels simultaneously offset cancelled in the related art. Further, even when the resolution of the panel rises, K does not change. Accordingly, it becomes easy to hold the precharge potential at the stable potential.

Then, for example a select switch 1032 of the data driver becomes ON and the data is transferred to the signal line SGL102, then a select switch 1032 turns OFF, a select switch 1033 turns ON, and the data is transferred to the signal line SGL103. When the luminance data is written into adjacent pixel circuits in a time division manner in this way, since there is a precharge potential line VPCL of the fixed potential between the signal line SGL102 and the signal line SGL103, electromagnetic coupling is blocked and crosstalk does not occur. For this reason, it becomes possible to write the correct luminance data.

According to the second embodiment, in the same way as the effect of the first embodiment explained above, there are the advantages that it is possible that crosstalk between pixels can be prevented with a relatively simple layout without three-dimensional electromagnetic shielding and it becomes possible to correctly write the luminance data.

Further, according to the second embodiment, since n number of columns' worth of the power supply potential lines VCCL101 to VCCL10n for supplying the power voltage Vcc and n number of columns' worth of the precharge potential lines VPCL101 to VPCL10n for supplying the reference voltage Vpc for offset cancellation are arranged for each pixel column in the same direction so as to be parallel to the signal lines SGL101 to SGL10n, it is possible to stably and correctly supply a current of the desired value to the light emitting element of each pixel without regard as to variation of the threshold value of the active elements inside the pixels, it is possible to stably hold the reference potential even when there is an offset cancellation function by the precharge potential line, and it is possible to prevent a gradient from being formed in the luminance of the displayed image. As a result, it is possible to display a high quality image.

Further, the power supply potential lines VCCL are made common at the top and bottom of the display region constituted by the pixel array 102A in the figure, that is, the two ends of the plurality of power supply potential lines VCCL101 to VCCL10n are connected in common to make the potentials the same. Therefore, it is possible to prevent uneven luminance due to the potential difference in the length direction occurring between the top and bottom of the power supply potential lines VCCL in the figure.

Note that, the pixel circuit 101A of FIG. 11 is an example. The present embodiment is not limited to this. For example, as mentioned above, the TFT 112 to TFT 115 are only switches, therefore it is clear that it is also possible to configure all or part of them by p-channel TFTs or other switch elements.

Third Embodiment

Figure 13:
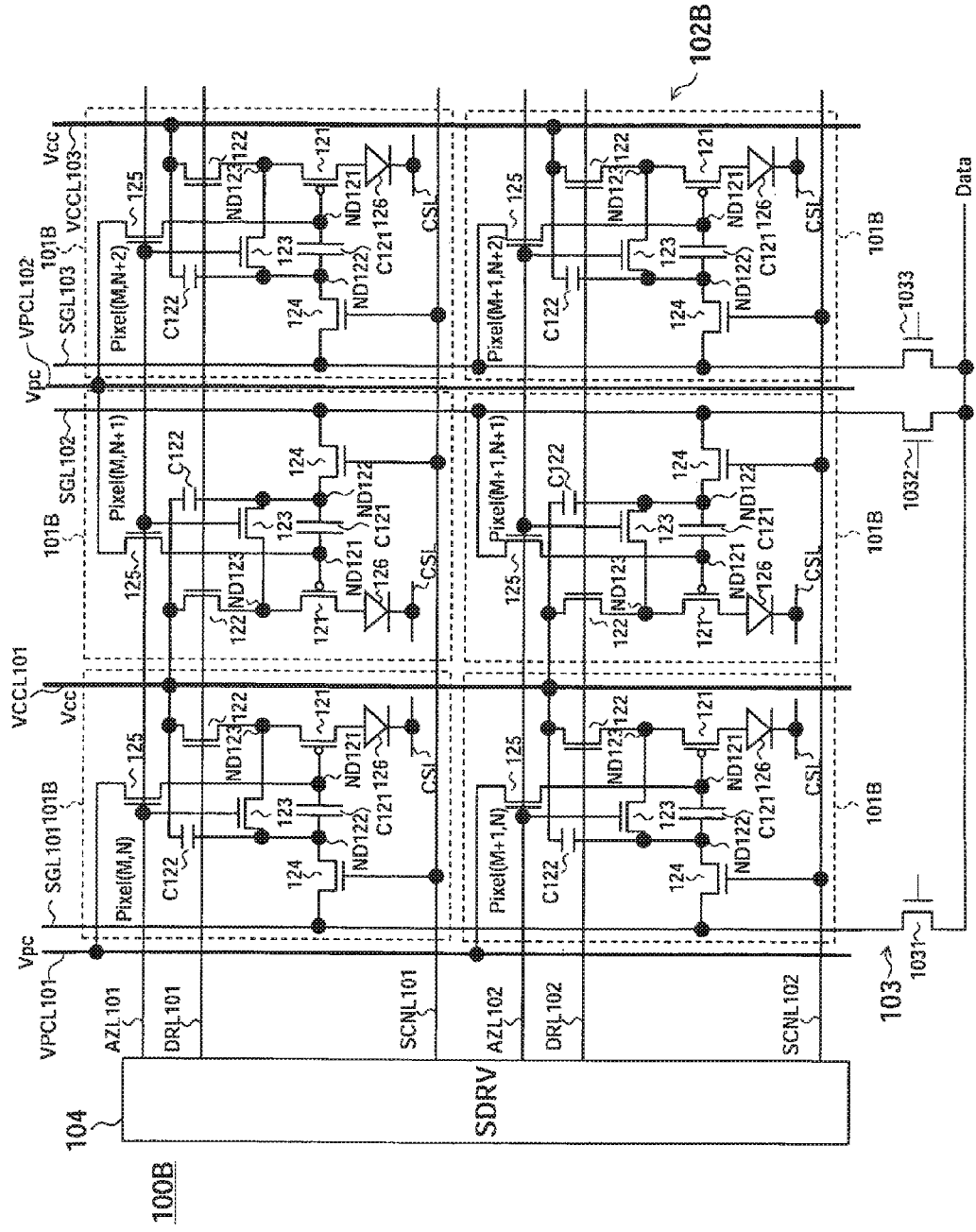
FIG. 13 is a circuit diagram of an active matrix type organic EL display (display device) according to a third embodiment of the present invention.

FIG. 13 is a circuit diagram of an active matrix type organic EL display device (display device) according to a third embodiment of the present invention.

The difference of the third embodiment from the second embodiment resides in the configuration of a pixel circuit 101B. Below, an explanation will be given of the configuration and the operation of a pixel circuit 101B according to the third embodiment.

Each of the pixel circuits 101B according to the third embodiment has, as shown in FIG. 13, a p-channel TFT 121, n-channel TFT 122 to TFT 125, capacitors C121 and C122, a light emitting element 126 made of an organic EL element OLED (electrooptic element) 126, and nodes ND121 to ND123. Among these components, TFT 121 forms the field effect transistor, TFT 122 forms the first switch, TFT 123 forms the second switch, TFT 125 forms the third switch, TFT 124 forms the fourth switch, and the capacitor C121 forms the capacitor of the present invention. Further, the scanning line SCNL corresponds to the first control line, and the auto zero line AZL corresponds to the second control line. Note that, the control line turning ON or OFF the TFT 125 used as the third switch may be the third control line different from the auto zero line AZL as well. Further, the supply line (power supply potential) of the power voltage $V_{cc}$ corresponds to the first reference potential, and the potential of the cathode line CSL (for example ground potential GND) corresponds to the second reference potential.

Note that, in the pixel array 102B, pixel circuits 101B are arranged in an m×n matrix. FIG. 13 shows an example in which they are arranged in a 2(=m)×3(=n) matrix for the simplification of the figure. Further, in FIG. 13, the 2×3 pixel circuits are also labeled as the "Pixel (M,N)", "Pixel (M,N+1)", "Pixel (M,N+2)", "Pixel (M+1,N)", "Pixel (M+1,N+1)", and "Pixel (M+1,N+2)".

Next, an explanation will be given of the specific configuration of each pixel circuit 101B.

In the pixel circuit "Pixel (M,N)" arranged at the first row and first column of FIG. 13, the source of the TFT 121 used as the drive transistor is connected to the node ND123 (the connection point of the source of the TFT 122 and the drain of the TFT 123), the drain is connected to the anode side of the organic EL element 126, and the cathode of the light emitting element 126 is connected to the cathode line CSL of a predetermined potential (for example, the ground potential). The source of the TFT 122 is connected to the node ND123 (source of the TFT 121), the drain is connected to the power supply potential line VCCL101 arranged at the first column, and the gate is connected to the drive line DRL101 arranged at the first row. The drain of the TFT 123 is connected to the node ND123 (source of the TFT 121), the source is connected to the node ND122 (source of the TFT 124), and the gate is connected to the auto zero line AZL101 arranged at the first row. A first electrode of the capacitor C121 is connected to the node ND121, and a second electrode is connected to the node ND122. Further, a first electrode of the capacitor C122 is connected to the node ND122, and a second electrode is connected to the power supply potential line VCCL101 arranged at the first column. The source of the TFT 124 is connected to the node ND122, the drain is connected to the signal line SGL101 arranged at the first column, and the gate is connected to the scanning line SCNL101 arranged at the first row. The source of the TFT 125 is connected to the node ND121 (gate of the TFT 121), and the drain is connected to the precharge potential line VPCL101 arranged at the first column.

In the pixel circuit "Pixel (M,N+1)" arranged at the first row and second column of FIG. 13, the source of the TFT 121 used as the drive transistor is connected to the node ND123 (the connection point of the source of the TFT 122 and the drain of the TFT 123), the drain is connected to the anode side of the organic EL element 126, and the cathode of the light emitting element 126 is connected to the cathode line CSL of a predetermined potential (for example, the ground potential). The source of the TFT 122 is connected to the node ND123 (source of the TFT 121), the drain is connected to the power supply potential line VCCL101 arranged at the first column, and the gate is connected to the drive line DRL101 arranged at the first row. The drain of the TFT 123 is connected to the node ND123 (source of the TFT 121), the source is connected to the node ND122 (source of the TFT 124), and the gate is connected to the auto zero line AZL101 arranged at the first row. A first electrode of the capacitor C121 is connected to the node ND121, and a second electrode is connected to the node ND122. Further, a first electrode of the capacitor C122 is connected to the node ND122, and a second electrode is connected to the power supply potential line VCCL101 arranged at the first column. The source of the TFT 124 is connected to the node ND122, the drain is connected to the signal line SGL102 arranged at the second column, and the gate is connected to the scanning line SCNL101 arranged at the first row. The source of the TFT 125 is connected to the node ND121 (gate of the TFT 121), and the drain is connected to the precharge potential line VPCL102 arranged at the second column.

In the pixel circuit "Pixel (M,N+2)" arranged at the first row and third column of FIG. 13, the source of the TFT 121 used as the drive transistor is connected to the node ND123 (the connection point of the source of the TFT 122 and the drain of the TFT 123), the drain is connected to the anode side of the organic EL element 126, and the cathode of the light emitting element 126 is connected to the cathode line CSL of a predetermined potential (for example, the ground potential). The source of the TFT 122 is connected to the node ND123 (source of the TFT 121), the drain is connected to the power supply potential line VCCL103 arranged at the third column, and the gate is connected to the drive line DRL101 arranged at the first row. The drain of the TFT 123 is connected to the node ND123 (source of the TFT 121), the source is connected to the node ND122 (source of the TFT 124), and the gate is connected to the auto zero line AZL101 arranged at the first row. A first electrode of the capacitor C121 is connected to the node ND121, and a second electrode is connected to the node ND122. Further, a first electrode of the capacitor C122 is connected to the node ND122, and a second electrode is connected to the power supply potential line VCCL103 arranged at the third column. The source of the TFT 124 is connected to the node ND122, the drain is connected to the signal line SGL103 arranged at the third column, and the gate is connected to the scanning line SCNL101 arranged at the first row. The source of the TFT 125 is connected to the node ND121 (gate of the TFT 121), and the drain is connected to the precharge potential line VPCL102 arranged at the second column.

In the pixel circuit "Pixel (M+1,N)" arranged at the second row and first column of FIG. 13, the source of the TFT 121 used as the drive transistor is connected to the node ND123 (the connection point of the source of the TFT 122 and the drain of the TFT 123), the drain is connected to the anode side of the organic EL element 126, and the cathode of the light emitting element 126 is connected to the cathode line CSL of a predetermined potential (for example, the ground potential). The source of the TFT 122 is connected to the node ND123 (source of the TFT 121), the drain is connected to the power supply potential line VCCL101 arranged at the first column, and the gate is connected to the drive line DRL102 arranged at the second row. The drain of the TFT 123 is connected to the node ND123 (source of the TFT 121), the source is connected to the node ND122 (source of the TFT 124), and the gate is connected to the auto zero line AZL102 arranged at the second row. A first electrode of the capacitor C121 is connected to the node ND121, and a second electrode is connected to the node ND122. Further, a first electrode of the capacitor C122 is connected to the node ND122, and a second electrode is connected to the power supply potential line VCCL101 arranged at the first column. The source of the TFT 124 is connected to the node ND122, the drain is connected to the signal line SGL101 arranged at the first column, and the gate is connected to the scanning line SCNL102 arranged at the second row. The source of the TFT 125 is connected to the node ND121 (gate of the TFT 121), and the drain is connected to the precharge potential line VPCL101 arranged at the first column.

In the pixel circuit "Pixel (M+1,N+1)" arranged at the second row and second column of FIG. 13, the source of the TFT 121 used as the drive transistor is connected to the node ND123 (the connection point of the source of the TFT 122 and the drain of the TFT 123), the drain is connected to the anode side of the organic EL element 126, and the cathode of the light emitting element 126 is connected to the cathode line CSL of a predetermined potential (for example, the ground potential). The source of the TFT 122 is connected to the node ND123 (source of the TFT 121), the drain is connected to the power supply potential line VCCL101 arranged at the first column, and the gate is connected to the drive line DRL102 arranged at the second row. The drain of the TFT 123 is connected to the node ND123 (source of the TFT 121), the source is connected to the node ND122 (source of the TFT 124), and the gate is connected to the auto zero line AZL102 arranged at the second row. A first electrode of the capacitor C121 is connected to the node ND121, and a second electrode is connected to the node ND122. Further, a first electrode of the capacitor C122 is connected to the node ND122, and a second electrode is connected to the power supply potential line VCCL101 arranged at the first column. The source of the TFT 124 is connected to the node ND122, the drain is connected to the signal line SGL102 arranged at the second column, and the gate is connected to the scanning line SCNL102 arranged at the second row. The source of the TFT 125 is connected to the node ND121 (gate of the TFT 121), and the drain is connected to the precharge potential line VPCL102 arranged at the second column.

In the pixel circuit "Pixel (M+1,N+2)" arranged at the second row and third column of FIG. 13, the source of the TFT 121 used as the drive transistor is connected to the node ND123 (the connection point of the source of the TFT 122 and the drain of the TFT 123), the drain is connected to the anode side of the organic EL element 126, and the cathode of the light emitting element 126 is connected to the cathode line CSL of a predetermined potential (for example, the ground potential). The source of the TFT 122 is connected to the node ND123 (source of the TFT 121), the drain is connected to the power supply potential line VCCL103 arranged at the third column, and the gate is connected to the drive line DRL102 arranged at the second row. The drain of the TFT 123 is connected to the node ND123 (source of the TFT 121), the source is connected to the node ND122 (source of the TFT 124), and the gate is connected to the auto zero line AZL102 arranged at the second row. A first electrode of the capacitor C121 is connected to the node ND121, and a second electrode is connected to the node ND122. Further, a first electrode of the capacitor C122 is connected to the node ND122, and a second electrode is connected to the power supply potential line VCCL103 arranged at the third column. The source of the TFT 124 is connected to the node ND122, the drain is connected to the signal line SGL103 arranged at the third column, and the gate is connected to the scanning line SCNL102 arranged at the second row. The source of the TFT 125 is connected to the node ND121 (gate of the TFT 121), and the drain is connected to the precharge potential line VPCL102 arranged at the second column.

Next, an explanation will be given of the operation of the pixel circuit 101B by referring to the timing charts shown in FIGS. 14A to 14E by taking as an example the "Pixel (M,N)" of FIG. 11.

Step ST11

Figure 14:
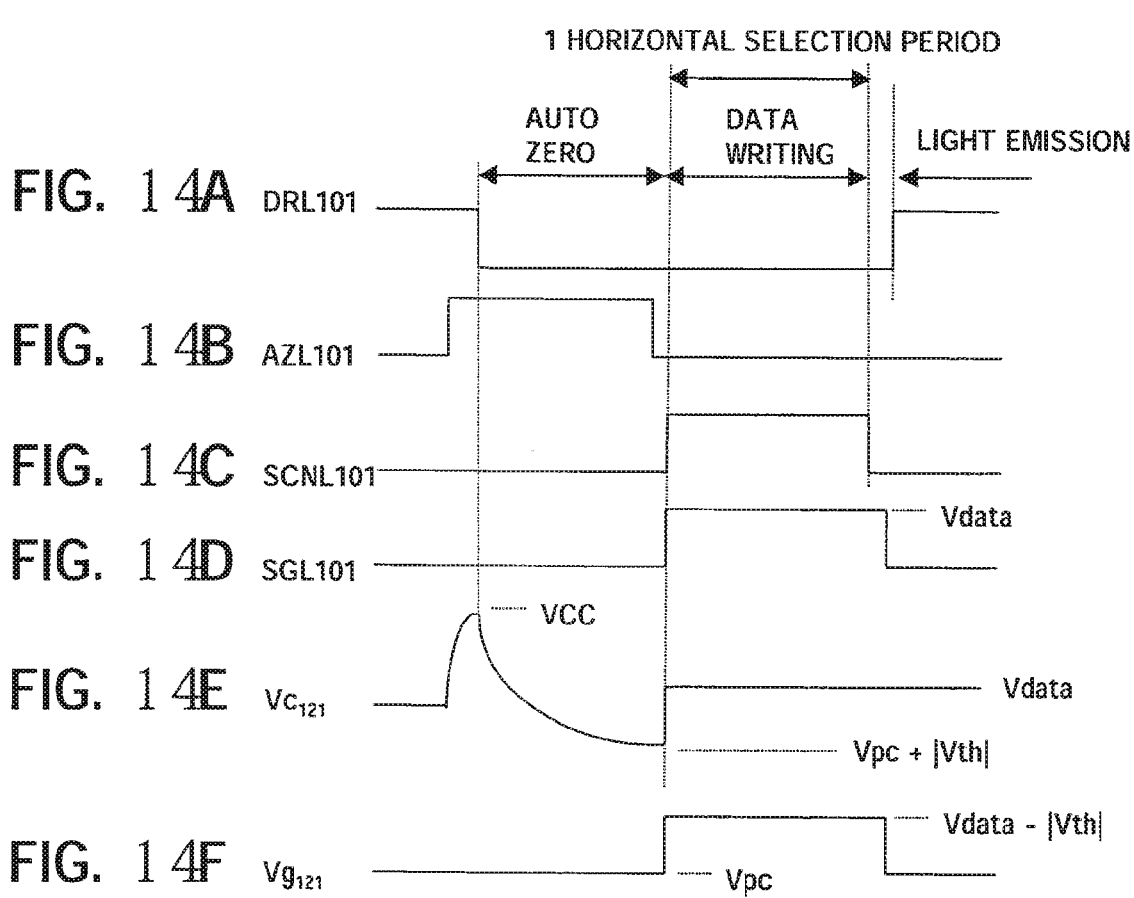
FIGS. 14A to 14F are timing charts for explaining the operation of the pixel circuit of FIG. 13.

First, as shown in FIGS. 14A and 14B, the drive line DRL101 and the auto zero line AZL101 are made the high level to make the TFT 122, TFT 123, and TFT 125 the conductive state. At this time, the gate of the TFT 121 becomes the precharge potential Vpc as shown in FIG. 14F by the TFT 125, and the input side potential VC121 of the capacitor C121 rises up to the power supply potential $V_{cc}$ or near it as shown in FIG. 14E since the TFT 122 and TFT 123 are in the conductive state.

Step ST12

As shown in FIG. 14A, the drive line DRL101 is made the low level to make the TFT 122 the nonconductive state. The current flowing in the TFT 121 is shut off, therefore the potential of the drain of the TFT 121 falls, but at the point of time when the potential falls to VPC+|Vth|, the TFT 121 becomes the nonconductive state and the potential is stabilized. At this time, the input side potential VC121 of the capacitor C121 is still VPC+|Vth| as shown in FIG. 14E since the TFT 123 is in the conductive state. Here, |Vth| is the absolute value of the threshold value of the TFT 121.

Step ST13

As shown in FIG. 14B, the auto zero line AZL101 is made the low level to make the TFT 123 and the TFT 125 the nonconductive state. The potential VC121 of the input side node of the capacitor C121 is VPC+|Vth| as shown in FIG. 14E, and the gate potential Vg121 of the TFT 121 is Vpc as shown in FIG. 14F. Namely, the potential difference between terminals of the capacitor C121 becomes |Vth|.

Step ST14

As shown in FIGS. 14C and 14D, the scanning line SCNL101 is made the high level to make the TFT 124 the conductive state, and the potential Vdata in accordance with the luminance data is given from the signal line SGL101 to the input side node ND121 of the capacitor C121. The potential difference between terminals of the capacitor C121 is held at |Vth| as it is, therefore the gate potential Vg121 of the TFT 121 becomes Vdata−|Vth| as shown in FIG. 14F.

Step ST15

As shown in FIGS. 14A and 14C, when the scanning line SCNL101 is made the low level to make the TFT 124 the nonconductive state, the drive line DRL101 is made the high level to make the TFT 122 the conductive state, the current flows in the TFT 121 and the light emitting element (OLED) 126, and the OLED starts the light emission.

Note that, in the operation of steps ST11 and ST12 described above, it is necessary to set the value of Vpc so that Vpc+|Vth| becomes smaller than VDD, but the value of Vpc may be any value so far as this is satisfied.

When calculating the current Ioled flowing in the light emitting element (OLED) 126 after the above operation, it becomes as follows if the TFT 121 is operating in the saturated region:

$$Ioled = \mu Cox W/L/2(Vgs-Vth)^2$$

$$= \mu Cox W/L/2(V_{cc}-Vg-|Vth|)^2$$

$$= \mu Cox W/L/2(V_{cc}-Vdata+|Vth|-|Vth|)^2$$

$$= \mu Cox W/L/2(V_{cc}-Vdata)^2 \quad (9)$$

Here, μ indicates the mobility of the carriers, Cox indicates the gate capacitance per unit area, W indicates the gate width, and L indicates the gate length. According to Equation (9), the current Ioled does not depend upon the threshold value Vth of the TFT 121 (not according to Vth), but is controlled by Vdata given from the outside. In other words, when the pixel circuit 101B of FIG. 13 is used, it is possible to realize a display device not affected by Vth varying for each pixel and having relatively high uniformity of current and consequently uniformity of luminance.

Further, even in the case where the TFT 121 is operating in the linear region, the current Ioled flowing in the light emitting element (OLED) 126 becomes as follows and still does not depend upon Vth:

$$Ioled = \mu CoxW/L\{(Vgs - Vth)Vds - Vds^2/2\} \quad (10)$$
$$= \mu CoxW/L\{(V_{cc} - Vg - |Vth|)(V_{cc} - Vd) - (V_{cc} - Vd)^2/2\}$$
$$= \mu CoxW/L\{(V_{cc} - Vdata + |Vth| - |Vth|)(V_{cc} - Vd) -$$
$$(V_{cc} - Vd)^2/2\}$$
$$= \mu CoxW/L\{(V_{cc} - Vdata)(V_{cc} - Vd) - (V_{cc} - Vd)^2/2\}$$

Here, Vd indicates the drain potential of the TFT 121.

Figure 1:
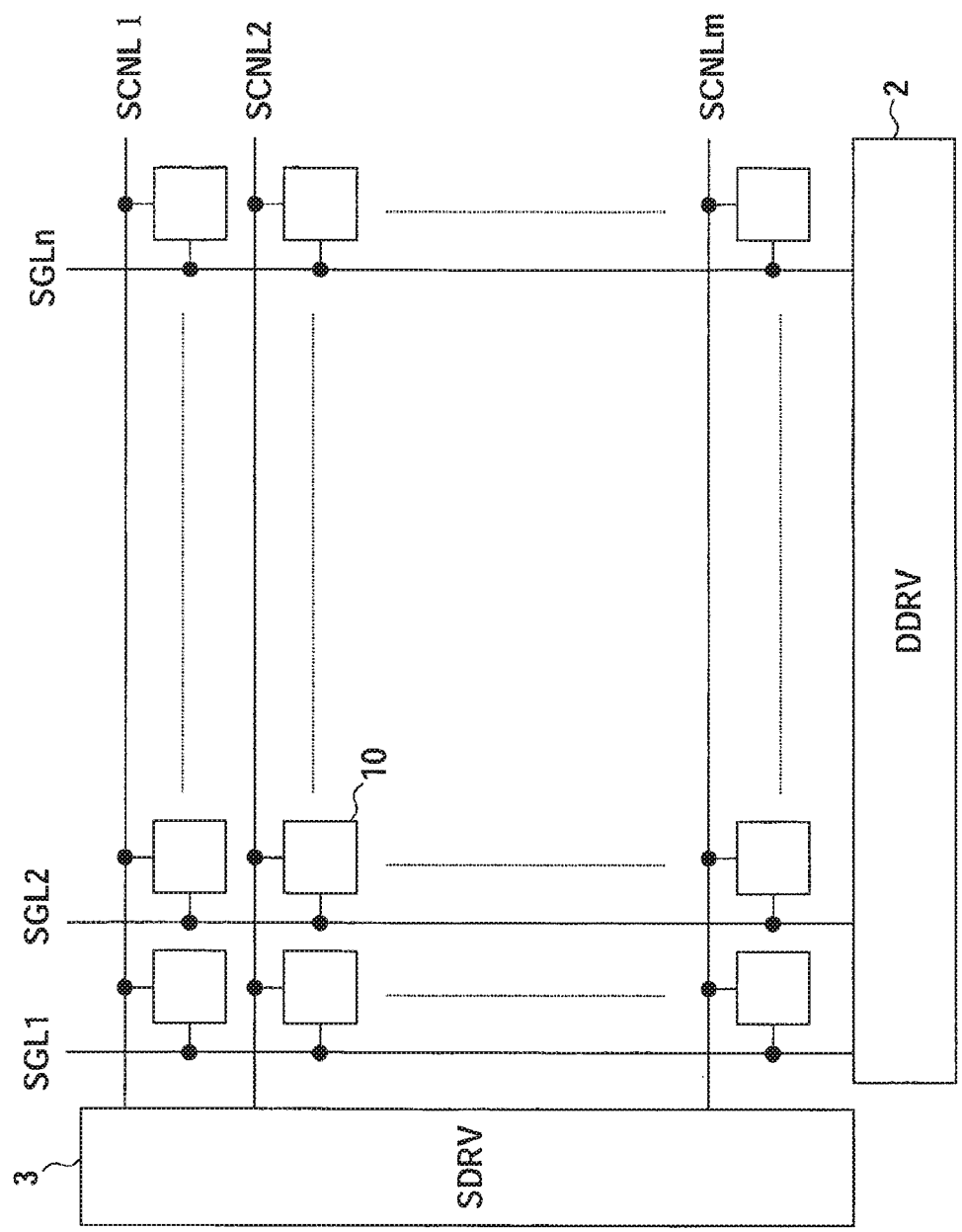
FIG. 1 is a block diagram of a general active matrix type organic EL display (display device)
Figure 2:
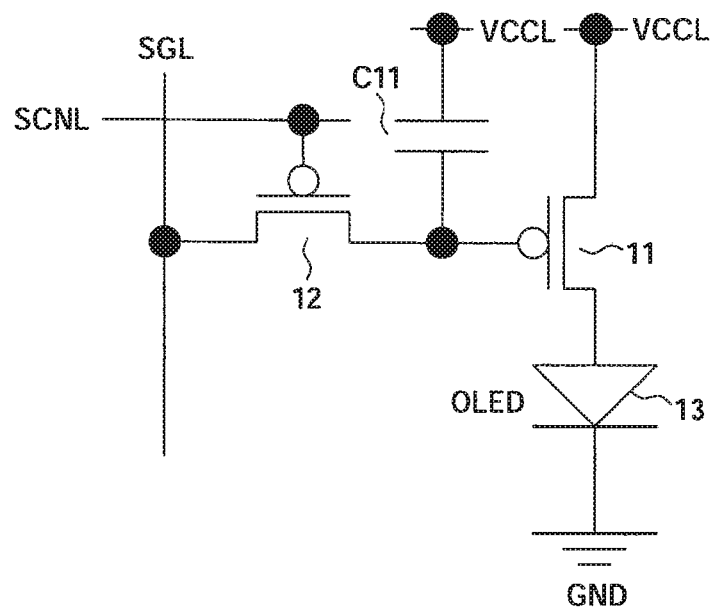
FIG. 2 is a circuit diagram of a first example of the configuration of a general pixel circuit.
Figure 3:
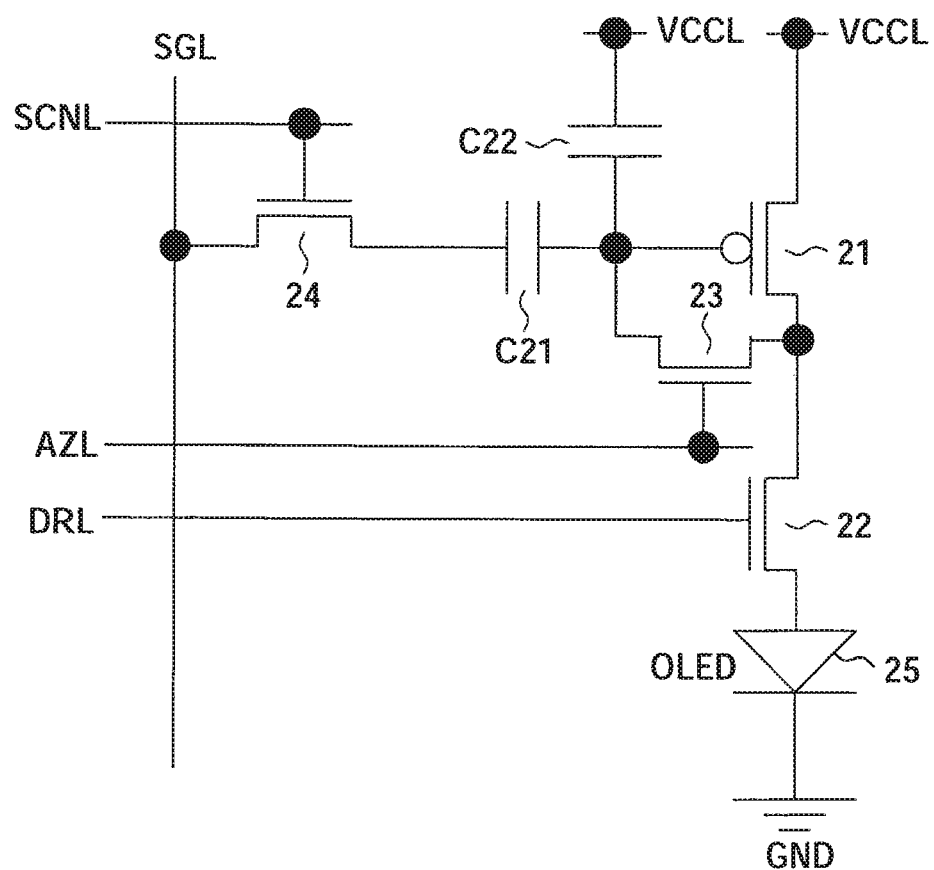
FIG. 3 is a circuit diagram of a second example of the configuration of a general pixel circuit.
Figure 4:
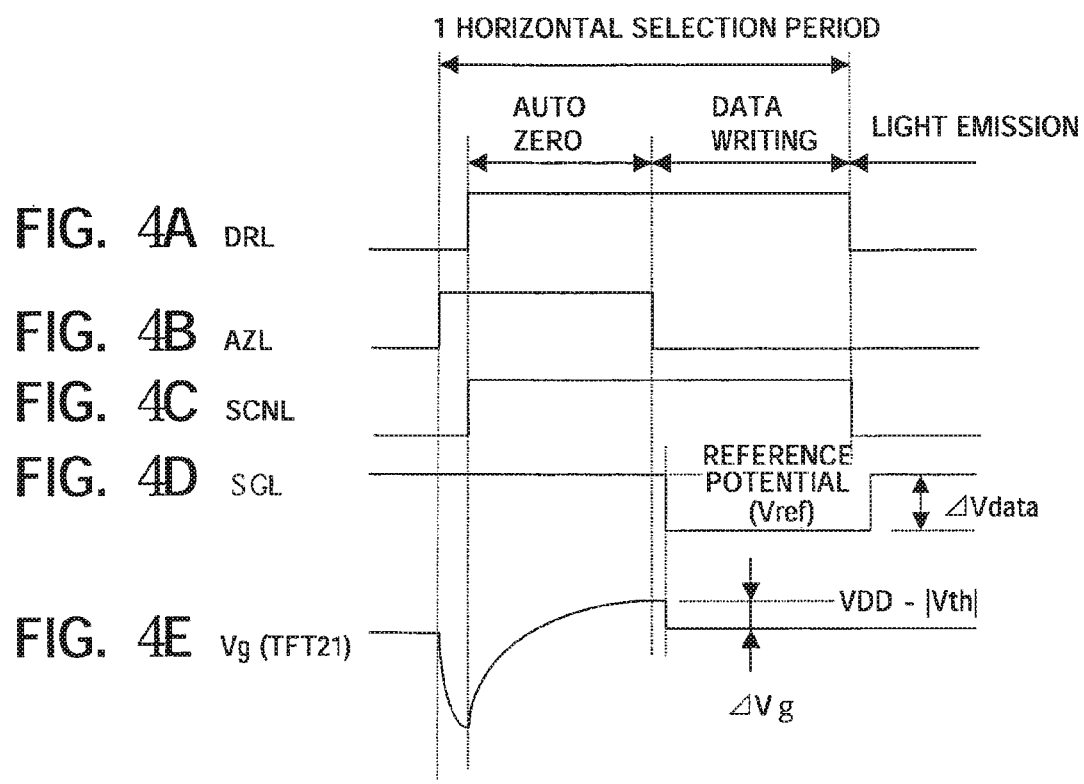
FIGS. 4A to 4E are timing charts for explaining a drive method of the circuit of FIG. 3.
Figure 5:
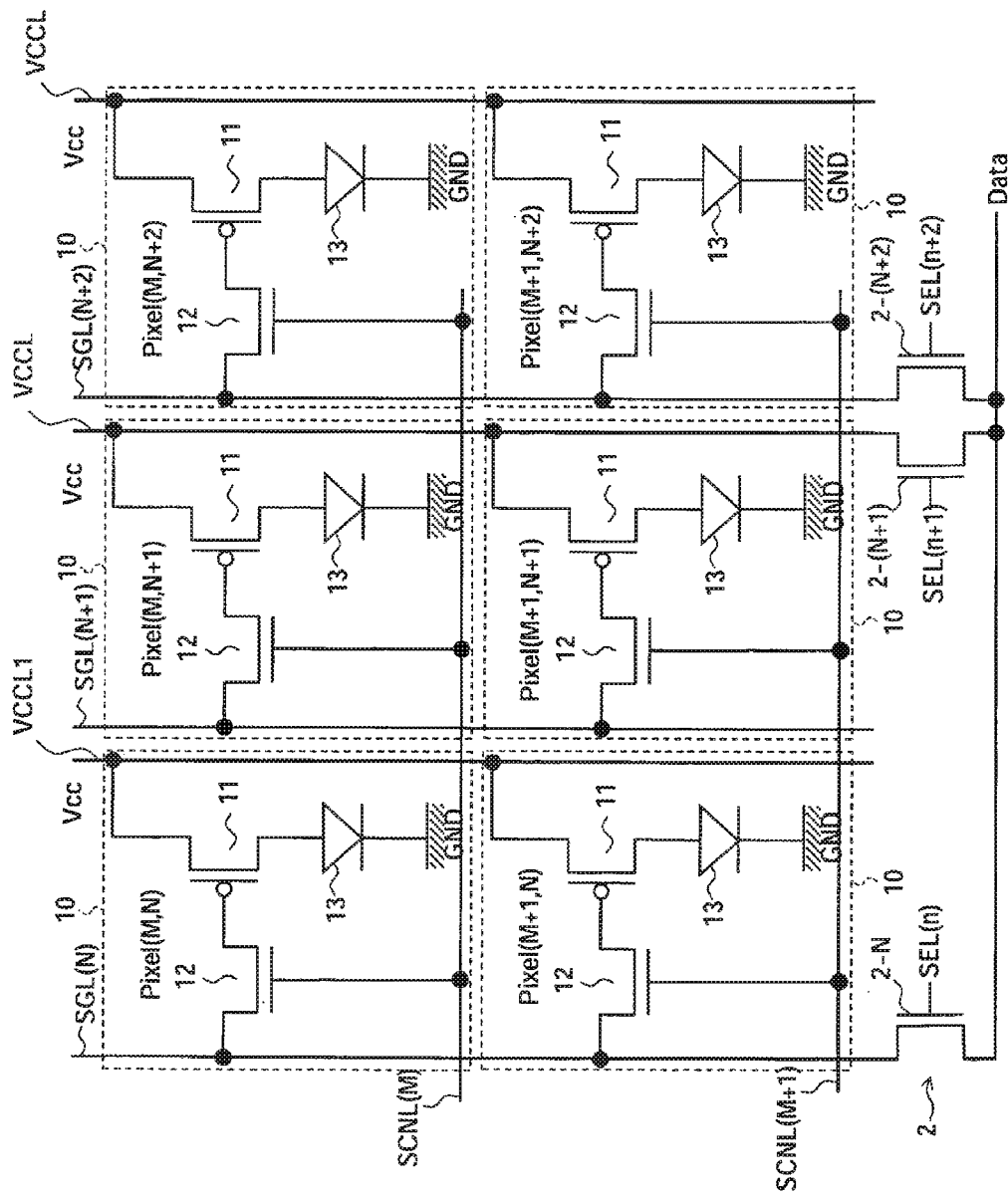
FIG. 5 is a circuit diagram for explaining an issue in the present invention.
Figure 6:
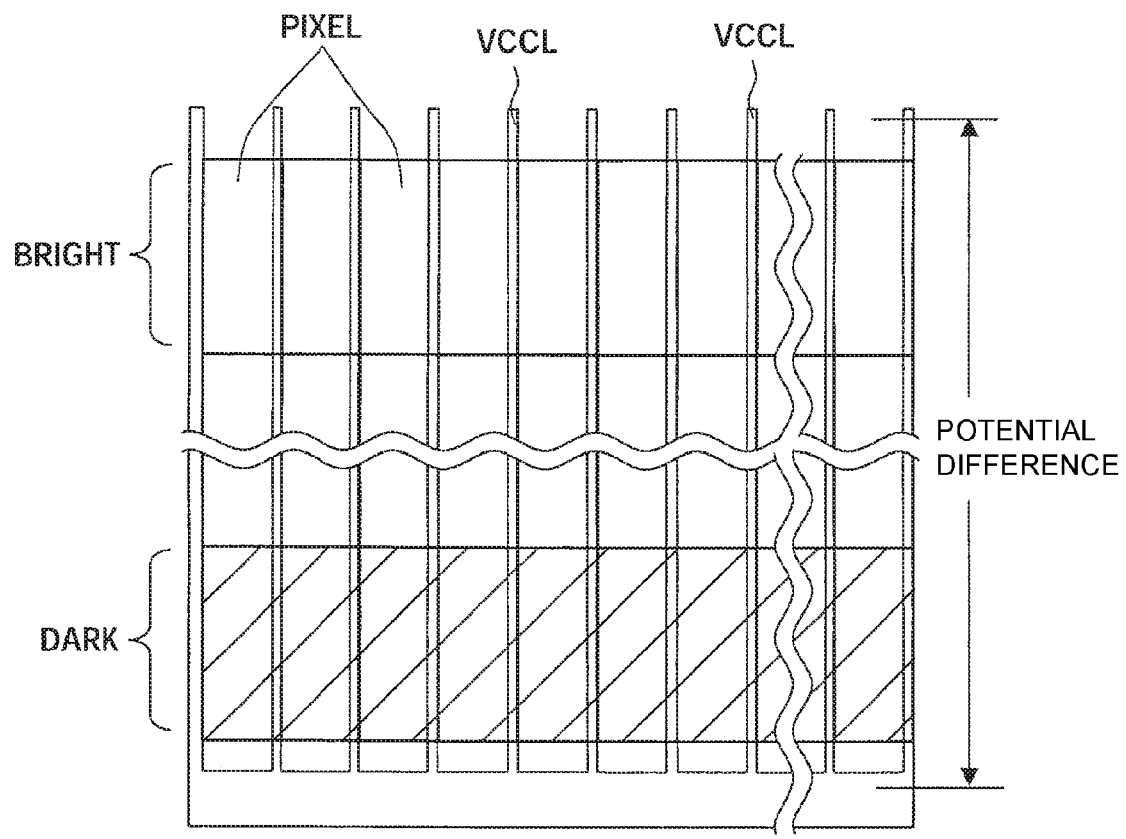
FIG. 6 is a view of a layout of power supply potential lines for explaining this issue in the present invention.
Figure 8:
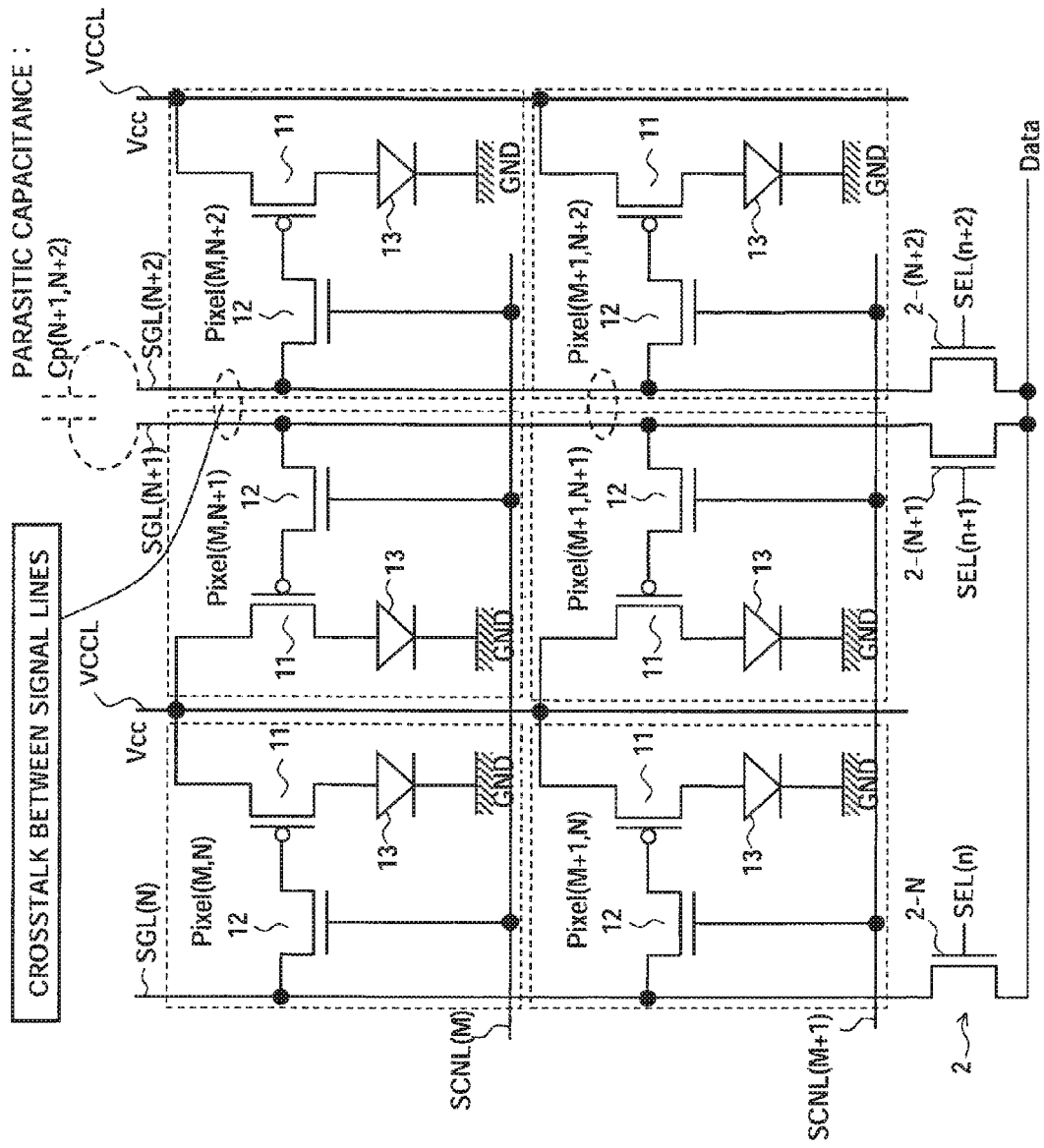
FIG. 8 is a view for explaining an issue in the case of a mirror type circuit arrangement.

As described above, the pixel circuit 101B of the third embodiment is more excellent than the example of the related art of FIG. 1 in the point that the influence of the variation of the threshold value Vth is able to be cancelled. It is more excellent than the example of the related art of FIG. 3 in the following points. First, in the related art of FIG. 3, there was the problem that the gate amplitude ΔVg of the drive transistor decreased according to Equation (2) from the data amplitude ΔVdata driven from the outside, but in the present embodiment, the data amplitude is substantially equal to the gate amplitude, accordingly it is possible to drive the pixel circuit with a smaller signal line amplitude. Due to this, drive by a lower power consumption and lower noise becomes possible. Second, looking at the capacitance coupling of the auto zero line and the gate of TFT which becomes a problem in the related art of FIG. 3, in the pixel circuit 101B of FIG. 13, the TFT 123 is not directly connected to the gate of the TFT 121, so the influence thereof is small. On the other hand, the TFT 125 is connected to the gate of the TFT 121, but the source of the TFT 125 is connected to the constant potential Vpc, therefore, even when the gate potential thereof changes at the time of the end of the auto zero operation, the gate potential of the TFT 121 is held at the potential of substantially Vpc. In this way, in the pixel circuit 101B of FIG. 13, the influence of coupling between the auto zero line AZL and the gate of the TFT 121 is small. As a result, the correction of the variation of Vth is carried out more correctly than the pixel circuit of FIG. 3. Namely, according to the present embodiment, it is possible to realize an organic EL use pixel circuit able to correctly supply current of a desired value to a light emitting element of the pixel circuit without regard to the variation of the threshold value of the transistors and as a result able to display a high quality image having a high luminance uniformity. As a result, correction of the threshold value with a higher precision than similar circuits in the past becomes possible.

Next, the timing of the offset cancellation will be considered. In the third embodiment as well, the precharge potential lines VPCL are arranged parallel to the signal lines SGL. At this time, the number of pixels connected to one of the precharge potential lines VPCL parallel to the signal lines SGL and simultaneously offset cancelled is K. Usually, K is the offset cancellation period and the time necessary for the sufficient offset. It is usually 1 to several tens or less and small in comparison with the number of pixels simultaneously offset cancelled in the related art. Further, even when the resolution of the panel rises, K does not change. Accordingly, it becomes easy to hold the precharge potential at a stable potential.

Then, for example the select switch 1032 of the data driver becomes ON and the data is transferred to the signal line SGL102, then the select switch 1032 turns OFF, the select switch 1033 turns ON, and the data is transferred to the signal line SGL103. When the luminance data is written into adjacent pixel circuits in a time division manner in this way, since there is a precharge potential line VPCL of a fixed potential between the signal line SGL102 and the signal line SGL103, electromagnetic coupling is blocked and crosstalk does not occur. For this reason, it becomes possible to write the correct luminance data.

According to the third embodiment, in the same way as the effects of the first embodiment mentioned above, there are the advantages that it is possible that crosstalk between pixels can be prevented with a relatively simple layout without three-dimensional electromagnetic shielding and it becomes possible to correctly write the luminance data.

Further, according to the third embodiment, there are effects the same as those by the second embodiment mentioned above, that is, it is possible to stably and correctly supply current of the desired value to the light emitting element of each pixel without regard to the variation of the threshold value of the active elements inside the pixels, it is possible to stably hold the reference potential even when there is an offset cancellation function by the precharge potential line, and it is possible to prevent a gradient from being formed in the luminance of the displayed image. As a result, there is the advantage that a high quality image is able to be displayed.

Further, in the third embodiment as well, the power supply potential lines VCCL are made common at the top and bottom of the display region constituted by the pixel array 102B in the figure, that is, the two ends of the plurality of power supply potential lines VCCL101 to VCCL10n are connected in common to make the potentials the same. Accordingly, it is possible to prevent uneven luminance due to the potential difference in the length direction occurring between the top and bottom of the power supply potential lines VCCL in the figure.

Note that the pixel circuit 101B of FIG. 13 is an example, and the present embodiment is not limited to this. For example, as mentioned above, the TFT 122 to TFT 125 are only switches, therefore it is clear that it is also possible to configure all or part of them by p-channel TFTs or other switch elements.

Fourth Embodiment

Figure 15:
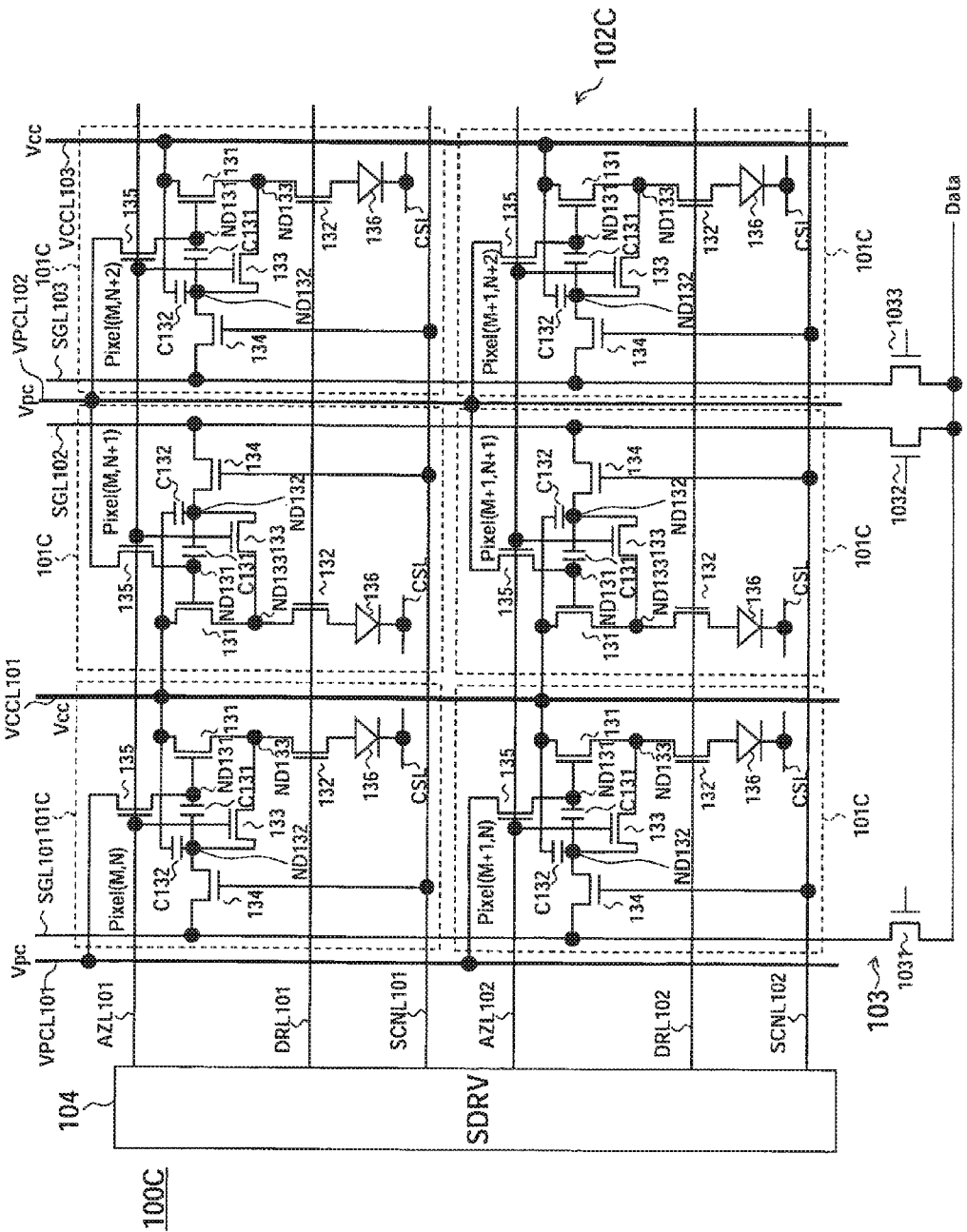
FIG. 15 is a circuit diagram of an active matrix type organic EL display (display device) according to a fourth embodiment of the present invention.

FIG. 15 is a circuit diagram of an active matrix type organic EL display device (display device) according to a fourth embodiment of the present invention.

The difference of the fourth embodiment from the above third embodiment resides in the configuration of a pixel circuit 101C. Below, an explanation will be given of the configuration and the operation of the pixel circuit 101C according to the fourth embodiment.

Each of the pixel circuits 101C according to the fourth embodiment has, as shown in FIG. 15, n-channel TFT 131 to TFT 135, capacitors C131 and C132, a light emitting element 136 made of an organic EL element OLED (electrooptic element) 136, and nodes ND131 to ND133. Among these components, the TFT 131 forms the field effect transistor, TFT 132 forms the first switch, TFT 133 forms the second switch, TFT 125 forms the third switch, and TFT 134 forms the fourth switch. Further, the scanning line SCNL corresponds to the first control line, and the auto zero line AZL corresponds to the second control line. Note that the control line turning ON or OFF the TFT 135 used as the third switch may be a third control line different from the auto zero line AZL as well. Further, the supply line (power supply potential) of the power voltage $V_{cc}$ corresponds to the first reference potential, and the potential of the cathode line CSL (for example ground potential GND) corresponds to the second reference potential.

Note that, in the present pixel array 102C, the pixel circuits 101C are arranged in an m×n matrix, but FIG. 15 shows an example in which they are arranged in a 2(=m)× 3(=n) matrix for simplification of the figure. Further, in FIG. 15, the 2×3 pixel circuits are also labeled as "Pixel (M,N)", "Pixel (M,N+1)", "Pixel (M,N+2)", "Pixel (M+1,N)", "Pixel (M+1,N+1)", and "Pixel (M+1,N+2)".

Next, an explanation will be given of the specific configuration of each pixel circuit 101C.

In the pixel circuit "Pixel (M,N)" arranged at the first row and first column of FIG. 15, the drain of the TFT 131 used as the drive transistor is connected to the power supply potential line VCCL101 arranged at the first column, the source is connected to the node ND133, and the gate is connected to the node ND131. The drain of the TFT 132 is connected to the node ND133 (source of the TFT 131), the source is connected to the anode side of the organic EL element 136, the gate is connected to the drive line DRL101 arranged at the first row, and the cathode of the light emitting element 136 is connected to the cathode line CSL of a predetermined potential (for example, the ground potential). The source of the TFT 133 is connected to the node ND133 (source of the TFT 131), the drain is connected to the node ND132 (source of the TFT 134), and the gate is connected to the auto zero line AZL101 arranged at the first row. A first electrode of the capacitor C131 is connected to the node ND131, and a second electrode is connected to the node ND132. Further, a first electrode of the capacitor C132 is connected to the node ND132, and a second electrode is connected to the power supply potential line VCCL101 arranged at the first column. The source of the TFT 134 is connected to the node ND134, the drain is connected to the signal line SGL101 arranged at the first column, and the gate is connected to the scanning line SCNL101 arranged at the first row. The source of the TFT 135 is connected to the node ND131, and the drain is connected to the precharge potential line VPCL101 arranged at the first column.

In the pixel circuit "Pixel (M,N+1)" arranged at the first row and second column of FIG. 15, the drain of the TFT 131 used as the drive transistor is connected to the power supply potential line VCCL101 arranged at the first column, the source is connected to the node ND133, and the gate is connected to the node ND131. The drain of the TFT 132 is connected to the node ND133 (source of the TFT 131), the source is connected to the anode side of the organic EL element 136, the gate is connected to the drive line DRL101 arranged at the first row, and the cathode of the light emitting element 136 is connected to the cathode line CSL of a predetermined potential (for example, the ground potential). The source of the TFT 133 is connected to the node ND133 (source of the TFT 131), the drain is connected to the node ND132 (source of the TFT 134), and the gate is connected to the auto zero line AZL101 arranged at the first row. A first electrode of the capacitor C131 is connected to the node ND131, and a second electrode is connected to the node ND132. Further, a first electrode of the capacitor C132 is connected to the node ND132, and a second electrode is connected to the power supply potential line VCCL101 arranged at the first column. The source of the TFT 134 is connected to the node ND132, the drain is connected to the signal line SGL102 arranged at the second column, and the gate is connected to the scanning line SCNL101 arranged at the first row. The source of the TFT 135 is connected to the node ND131, and the drain is connected to the precharge potential line VPCL102 arranged at the second column.

In the pixel circuit "Pixel (M,N+2)" arranged at the first row and third column of FIG. 15, the drain of the TFT 131 used as the drive transistor is connected to the power supply potential line VCCL103 arranged at the third column, the source is connected to the node ND133, and the gate is connected to the node ND131. The drain of the TFT 132 is connected to the node ND133 (source of the TFT 131), the source is connected to the anode side of the organic EL element 136, the gate is connected to the drive line DRL101 arranged at the first row, and the cathode of the light emitting element 136 is connected to the cathode line CSL of a predetermined potential (for example, the ground potential). The source of the TFT 133 is connected to the node ND133 (source of the TFT 131), the drain is connected to the node ND132 (source of the TFT 134), and the gate is connected to the auto zero line AZL101 arranged at the first row. A first electrode of the capacitor C131 is connected to the node ND131, and a second electrode is connected to the node ND132. Further, a first electrode of the capacitor C132 is connected to the node ND132, and a second electrode is connected to the power supply potential line VCCL103 arranged at the third column. The source of the TFT 134 is connected to the node ND132, the drain is connected to the signal line SGL103 arranged at the third column, and the gate is connected to the scanning line SCNL101 arranged at the first row. The source of the TFT 135 is connected to the node ND131, and the drain is connected to the precharge potential line VPCL102 arranged at the second column.

In the pixel circuit "Pixel (M+1,N)" arranged at the second row and first column of FIG. 15, the drain of the TFT 131 used as the drive transistor is connected to the power supply potential line VCCL101 arranged at the first column, the source is connected to the node ND133, and the gate is connected to the node ND131. The drain of the TFT 132 is connected to the node ND133 (source of the TFT 131), the source is connected to the anode side of the organic EL element 136, the gate is connected to the drive line DRL102 arranged at the second row, and the cathode of the light emitting element 136 is connected to the cathode line CSL of a predetermined potential (for example, the ground potential). The source of the TFT 133 is connected to the node ND133 (source of the TFT 131), the drain is connected to the node ND132 (source of the TFT 134), and the gate is connected to the auto zero line AZL102 arranged at the second row. A first electrode of the capacitor C131 is connected to the node ND131, and a second electrode is connected to the node ND132. Further, a first electrode of the capacitor C132 is connected to the node ND132, and a second electrode is connected to the power supply potential line VCCL101 arranged at the first column. The source of the TFT 134 is connected to the node ND132, the drain is connected to the signal line SGL101 arranged at the first column, and the gate is connected to the scanning line SCNL102 arranged at the second row. The source of the TFT 135 is connected to the node ND131, and the drain is connected to the precharge potential line VPCL101 arranged at the first column.

In the pixel circuit "Pixel (M+1,N+1)" arranged at the second row and second column of FIG. 15, the drain of the TFT 131 used as the drive transistor is connected to the power supply potential line VCCL101 arranged at the first column, the source is connected to the node ND133, and the gate is connected to the node ND131. The drain of the TFT 132 is connected to the node ND133 (source of the TFT 131), the source is connected to the anode side of the organic EL element 136, the gate is connected to the drive line DRL102 arranged at the second row, and the cathode of the light emitting element 136 is connected to the cathode line CSL of a predetermined potential (for example, the ground potential). The source of the TFT 133 is connected to the node ND133 (source of the TFT 131), the drain is connected to the node ND132 (source of the TFT 134), and the gate is connected to the auto zero line AZL102 arranged at the second row. A first electrode of the capacitor C131 is connected to the node ND131, and a second electrode is connected to the node ND132. Further, a first electrode of the capacitor C132 is connected to the node ND132, and a second electrode is connected to the power supply potential line VCCL101 arranged at the first column. The source of the TFT 134 is connected to the node ND132, the drain is connected to the signal line SGL102 arranged at the second column, and the gate is connected to the scanning line SCNL102 arranged at the second row. The source of the TFT 135 is connected to the node ND131, and the drain is connected to the precharge potential line VPCL102 arranged at the second column.

In the pixel circuit Pixel "(M+1,N+2)" arranged at the second row and third column of FIG. 15, the drain of the TFT 131 used as the drive transistor is connected to the power supply potential line VCCL103 arranged at the third column, the source is connected to the node ND133, and the gate is connected to the node ND131. The drain of the TFT 132 is connected to the node ND133 (source of the TFT 131), the source is connected to the anode side of the organic EL element 136, the gate is connected to the drive line DRL102 arranged at the second row, and the cathode of the light emitting element 113 is connected to the cathode line CSL of a predetermined potential (for example, the ground potential). The source of the TFT 133 is connected to the node ND133 (source of the TFT 131), the drain is connected to the node ND132 (source of the TFT 134), and the gate is connected to the auto zero line AZL102 arranged at the second row. A first electrode of the capacitor C131 is connected to the node ND131, and a second electrode is connected to the node ND132. Further, a first electrode of the capacitor C132 is connected to the node ND132, and a second electrode is connected to the power supply potential line VCCL103 arranged at the third column. The source of the TFT 134 is connected to the node ND132, the drain is connected to the signal line SGL103 arranged at the third column, and the gate is connected to the scanning line SCNL102 arranged at the second row. The source of the TFT 135 is connected to the node ND132, and the drain is connected to the precharge potential line VPCL102 arranged at the second column.

The biggest difference between the pixel circuit 101C of FIG. 15 and the pixel circuit 101B of FIG. 13 resides in the point that the TFT 131 used as the drive transistor for controlling the current flowing in the light emitting element (OLED) 46 is an n-channel, and the source thereof and the organic EL element (OLED) are connected via the TFT 132 used as the switch.

Next, an explanation will be given of the operation of the pixel circuit 101C by referring to the timing charts of FIGS. 16A to 16F by taking as an example the "Pixel (M,N)" of FIG. 15.

Step ST21

Figure 16:
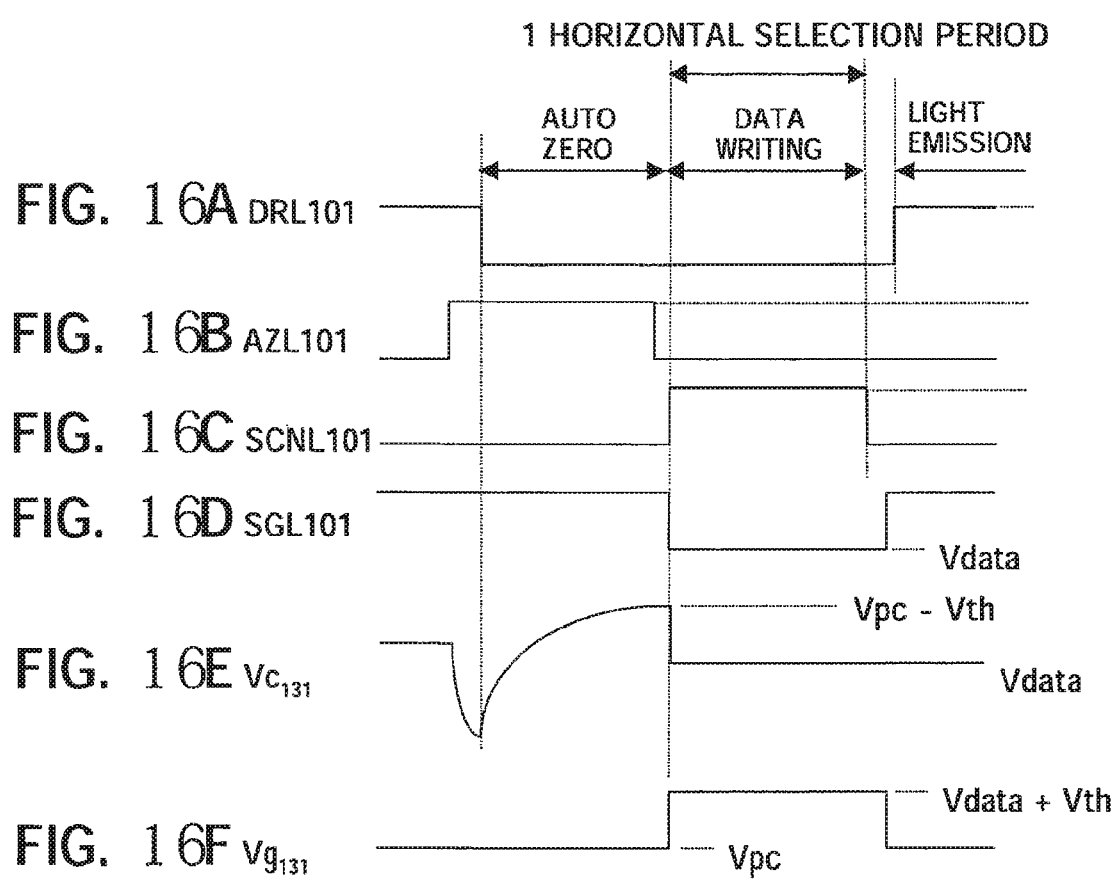
FIGS. 16A to 16F are timing charts for explaining the operation of the pixel circuit of FIG. 15.

As shown in FIGS. 16A and 16B, the drive line DRL101 and the auto zero line AZL101 are made the high level to make the TFT 132, TFT 133, and TFT 135 the conductive state. At this time, the gate potential Vg131 of the TFT 131 becomes the precharge potential Vpc as shown in FIG. 16F by the TFT 135. When the Vpc is made a sufficient high potential, the TFT 131 becomes the conductive state, and the current flows in the TFT 131 and the light emitting element (OLED) 136.

Step ST22

As shown in FIG. 16A, the drive line DRL is made the low level to make the TFT 132 the nonconductive state. The current flowing in the TFT 131 is shut off, therefore the source potential of the TFT 131 rises, but at the point of time when the potential rises up to (Vpc−Vth), the TFT 131 becomes the nonconductive state and the potential is stabilized. At this time, the input side potential VC131 of the capacitor C131 is still (Vpc−Vth) as shown in FIG. 16E since the TFT 133 is in the conductive state. Here, Vth is the absolute value of the threshold value of the TFT 131.

Step ST23

As shown in FIGS. 16B, the auto zero line AZL101 is made the low level to make the TFT 133 and the TFT 135 the nonconductive state. The potential VC131 of the input side node ND131 of the capacitor C131 is (Vpc−Vth) as shown in FIG. 16E, and the gate potential Vg131 of the TFT 131 is Vpc as shown in FIG. 16F. Namely, the potential difference between terminals of the capacitor C131 becomes Vth.

Step ST24

As shown in FIGS. 16C and 16D, the scanning line SCNL101 is made the high level to make the TFT 134 the conductive state, and the potential Vdata in accordance with the luminance data is given from the signal line SGL101 to the input side node ND131 of the capacitor C131. The potential difference between terminals of the capacitor C131 is held at Vth as it is, therefore the gate potential Vg131 of the TFT 131 becomes (Vdata+Vth) as shown in FIG. 16F.

Step ST25

As shown in FIGS. 16A and 16C, when the scanning line SCNL101 is made the low level to make the TFT 134 the nonconductive state and the drive line DRL101 is made the high level to make the TFT 132 the conductive state, the current flows in the TFT 131 and the light emitting element (OLED) 136, and the light emitting element (OLED) 136 starts the light emission.

Note that, in the operation of steps ST21 and ST22 described above, it is necessary to set the value of Vpc so that Vpc−Vth becomes larger than Vth_el when Vth_el is the threshold value of the light emitting element (OLED), but the value of Vpc may be any value so far as this is satisfied.

When calculating the current Ioled flowing in the light emitting element (OLED) 136 after the above operation, it becomes as follows if the TFT 131 is operating in the saturated region:

$$\begin{aligned}Ioled &= \mu CoxW/L/2(Vgs-Vth)^2 \quad (11)\\ &= \mu CoxW/L/2(V_{cc}-Vs-Vth)^2\\ &= \mu CoxW/L/2(Vdata+Vth-Vs-Vth)^2\\ &= \mu CoxW/L/2(Vdata-Vs)^2\end{aligned}$$

Here, μ indicates the mobility of the carriers, Cox indicates the gate capacitance per unit area, W indicates the gate width, and L indicates the gate length. According to Equation (11), the current Ioled flowing in the light emitting element (OLED) 136 does not depend upon the threshold value Vth of the TFT 131, but is controlled by Vdata given from the outside. In other words, when the pixel circuit 101C of FIG. 15 is used, it is possible to realize a display device not affected by the Vth varying for each pixel and having a relatively high uniformity of current, consequently uniformity of the luminance. This is true also for the case where the TFT 131 is operating in the linear region.

Further, for example, when the select switch 1032 of the data driver becomes ON and the data is transferred to the signal line SGL102, then the select switch 1032 turns OFF, the select switch 1033 turns ON, and the data is transferred to the signal line SGL103, there is a precharge potential line VPCL102 of the fixed potential between the signal line SGL102 and the signal line SGL103, therefore electromagnetic coupling is blocked and no crosstalk occurs. For this reason, it becomes possible to write the correct luminance data.

According to the fourth embodiment, in the same way as the effects of the second and third embodiments mentioned above, there are the advantages that it is possible to prevent crosstalk between pixels by a relatively simple layout without three-dimensional electromagnetic shielding and it becomes possible to correctly write the luminance data.

Further, according to the fourth embodiment, there are effects the same as those by the second and third embodiments mentioned above, that is, it is possible to stably and correctly supply a current of the desired value to the light emitting element of each pixel without regard to variation of the threshold value of the active elements inside the pixels, it is possible to stably hold the reference potential even when there is an offset cancellation function by the precharge potential line, and it is possible to prevent a gradient from being formed in the luminance of the displayed image. As a result, there is the advantage that a high quality image is able to be displayed.

Further, in the fourth embodiment as well, the power supply potential lines VCCL are made common at the top and bottom of the display region constituted by the pixel array 102C in the figure, that is, the two ends of the plurality of power supply potential lines VCCL101 to VCCL10n are connected in common to make the potentials the same. Accordingly, it is possible to prevent uneven luminance due to the potential difference in the length direction occurring between the top and bottom of the power supply potential lines VCCL in the figure.

Note that, the pixel circuit 101C of FIG. 15 is an example, and the present embodiment is not limited to this. For example, as mentioned above, the TFT 132 to TFT 135 are only switches, therefore it is clear that it is also possible to configure all or part of them by p-channel TFTs or other switch elements.

In the above, the explanation was given by taking as an example a mirror type circuit arrangement. In the following description, an explanation will be given of an example of the configuration of an active matrix type organic EL display device (display device) not having a mirror type circuit arrangement.

Fifth Embodiment

Figure 17:
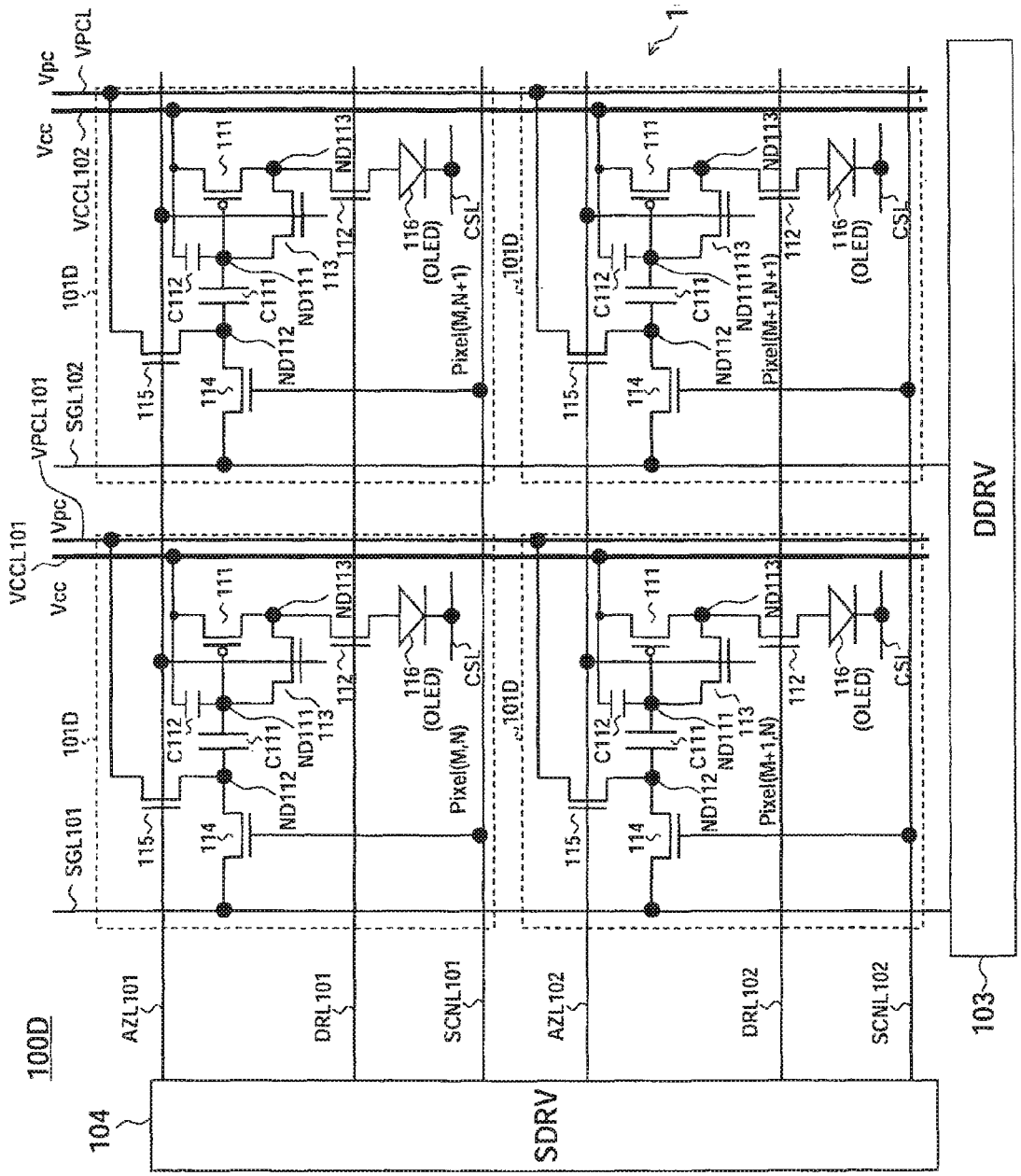
FIG. 17 is a circuit diagram of an active matrix type organic EL display (display device) according to a fifth embodiment of the present invention.
Figure 18:
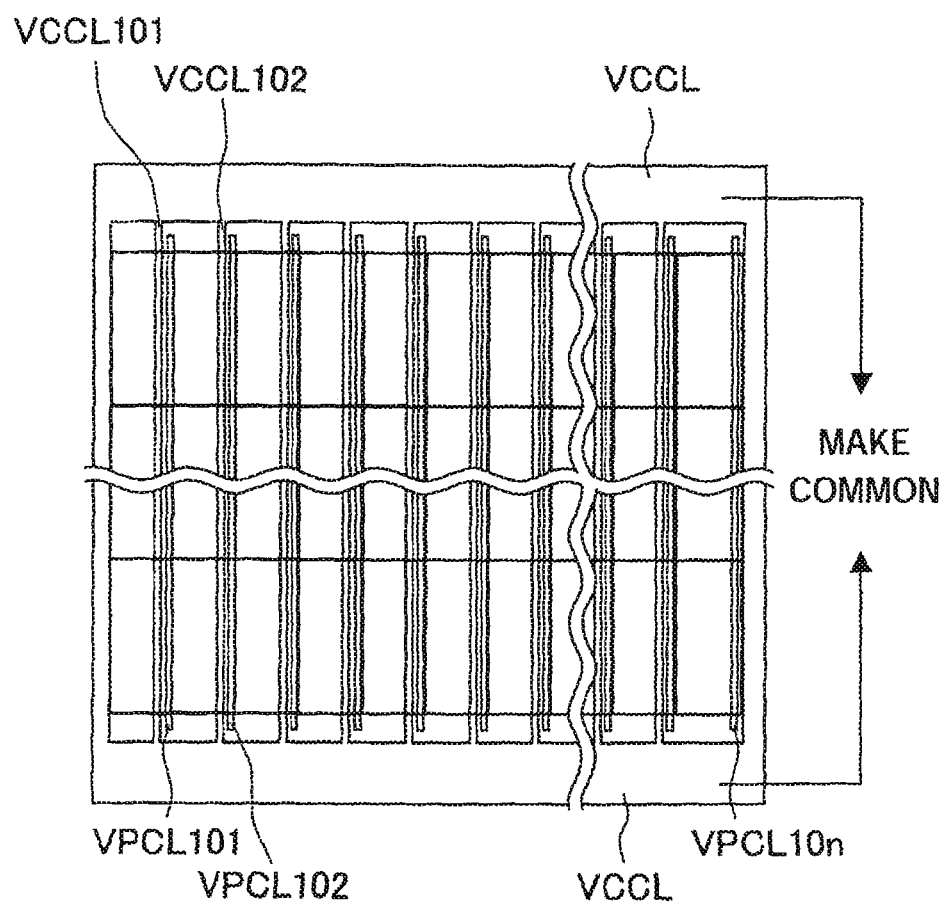
FIG. 18 is a diagram of a layout of power supply lines of the active matrix type organic EL display according to the fifth embodiment.

FIG. 17 is a circuit diagram of an active matrix type organic EL display device (display device) according to a fifth embodiment of the present invention. Further, FIG. 18 is a diagram of a layout of the power supply lines of the active matrix type organic EL display device according to the fifth embodiment.

The difference of the organic EL display 100D according to the fifth embodiment from the organic EL display 100A according to the second embodiment resides in that non-mirror type circuit arrangement is provided. The rest of the configuration of the organic EL display 100D is the same as that of the second embodiment, so the same components in FIG. 17 as in FIG. 11 are represented by the same notations.

The organic EL display 100D has, as shown in FIG. 17, a pixel array 102D including pixel circuits 101D arranged in an m×n matrix, a data driver (DDRV) 103, and a scan driver (SDRV) 104. Further, n number of columns' worth of the signal lines SGL101 to SGL10n driven by the data driver (DDRV) 103 are arranged for each pixel column of the matrix array of the pixel circuits 101D, and m number of rows' worth of the scanning lines SCNL101 to SCNL10m, drive lines DRL101 to DRV10m, and auto zero lines AZL101 to AZL10m selectively driven by the scan driver (SDRV) 104 are arranged for each pixel row.

Further, in the present embodiment, n number of columns' worth of the power supply potential lines VCCL101 to VCCL10n for supplying the power voltage Vcc and n number of columns' worth of precharge potential lines VPCL101 to VPCL10n for supplying the reference voltage Vpc for the offset cancellation are arranged for each pixel column in the same direction so as to be parallel to the signal lines SGL101 to SGL10n.

Further, in the present embodiment, the power supply potential lines VCCL, as shown in FIG. 18, are made common at the top and bottom of the display region constituted by the pixel array 102D in the figure, that is, the two ends of the plurality of power supply potential lines VCCL101 to VCCL10n are connected in common to make the potentials the same in order to prevent uneven luminance due to the potential difference in the length direction occurring between the top and bottom of the power supply potential lines VCCL in the figure.

Note that, in the present pixel array 102D, the pixel circuits 101D are arranged in an m×n matrix, but FIG. 17 shows an example where they are arranged in a 2(=m)×2 (=n) matrix for simplification of the figure. Further, in FIG. 17, the 2×2 pixel circuits are also labeled as the "Pixel (M,N)", "Pixel (M,N+1)", "Pixel (M+1,N)", and "Pixel (M+1,N+1)".

Next, an explanation will be given of the specific configuration of each pixel circuit 101D.

The pixel circuit 101D basically has the same configuration as that of the circuit of FIG. 11. Specifically, the pixel circuit 101D has, as shown in FIG. 17, one p-channel TFT 111, four n-channel TFT 112 to TFT 115, an organic EL element 116, capacitors C111 and C112, and nodes ND111 to ND113.

In the pixel circuit "Pixel (M,N)" arranged at the first row and first column of FIG. 17, the source of the TFT 111 used as the drive transistor is connected to the power supply potential line VCCL101 arranged at the first column, the drain is connected to the node ND113, and the gate is connected to the node ND111. The drain of the TFT 112 is connected to the node ND113 (drain of the TFT 111), the source is connected to the anode side of the organic EL element 116, the gate is connected to the drive line DRL101 arranged at the first row, and the cathode of the light emitting element 116 is connected to the cathode line CSL of a predetermined potential (for example, the ground potential). The source of the TFT 113 is connected to the node ND113 (drain of the TFT 111), the drain is connected to the node ND111 (gate of the TFT 111), and the gate is connected to the auto zero line AZL101 arranged at the first row. A first electrode of the capacitor C111 is connected to the node ND111, and a second electrode is connected to the node ND112. Further, a first electrode of the capacitor C112 is connected to the node ND111, and a second electrode is connected to the power supply potential line VCCL101 arranged at the first column. The source of the TFT 114 is connected to the node ND112, the drain is connected to the signal line SGL101 arranged at the first column, and the gate is connected to the scanning line SCNL101 arranged at the first row. The source of the TFT 115 is connected to the node ND112, and the drain is connected to the precharge potential line VPCL101 arranged at the first column.

In the pixel circuit "Pixel (M+1,N)" arranged at the second row and first column of FIG. 17, the source of the TFT 111 used as the drive transistor is connected to the power supply potential line VCCL101 arranged at the first column, the drain is connected to the node ND113, and the gate is connected to the node ND111. The drain of the TFT 112 is connected to the node ND113 (drain of the TFT 111), the source is connected to the anode side of the organic EL element 116, the gate is connected to the drive line DRL102 arranged at the second row, and the cathode of the light emitting element 116 is connected to the cathode line CSL of a predetermined potential (for example, the ground potential). The source of the TFT 113 is connected to the node ND113 (drain of the TFT 111), the drain is connected to the node ND111 (gate of the TFT 111), and the gate is connected to the auto zero line AZL102 arranged at the second row. A first electrode of the capacitor C111 is connected to the node ND111, and a second electrode is connected to the node ND112. Further, a first electrode of the capacitor C112 is connected to the node ND111, and a second electrode is connected to the power supply potential line VCCL101 arranged at the first column. The source of the TFT 114 is connected to the node ND112, the drain is connected to the signal line SGL101 arranged at the first column, and the gate is connected to the scanning line SCNL102 arranged at the second row. The source of the TFT 115 is connected to the node ND112, and the drain is connected to the precharge potential line VPCL101 arranged at the first column.

In the pixel circuit "Pixel (M,N+1)" arranged at the first row and second column of FIG. 17, the source of the TFT 111 used as the drive transistor is connected to the power supply potential line VCCL102 arranged at the second column, the drain is connected to the node ND113, and the gate is connected to the node ND111. The drain of the TFT 112 is connected to the node ND113 (drain of the TFT 111), the source is connected to the anode side of the organic EL element 116, the gate is connected to the drive line DRL101 arranged at the first row, and the cathode of the light emitting element 116 is connected to the cathode line CSL of a predetermined potential (for example, the ground potential). The source of the TFT 113 is connected to the node ND113 (drain of the TFT 111), the drain is connected to the node ND111 (gate of the TFT 111), and the gate is connected to the auto zero line AZL101 arranged at the first row. A first electrode of the capacitor C111 is connected to the node ND111, and a second electrode is connected to the node ND112. Further, a first electrode of the capacitor C112 is connected to the node ND111, and a second electrode is connected to the power supply potential line VCCL102 arranged at the second column. The source of the TFT 114 is connected to the node ND112, the drain is connected to the signal line SGL102 arranged at the second column, and the gate is connected to the scanning line SCNL101 arranged at the first row. The source of the TFT 115 is connected to the node ND112, and the drain is connected to the precharge potential line VPCL102 arranged at the second column.

In the pixel circuit "Pixel (M+1,N+1)" arranged at the second row and second column of FIG. 17, the source of the TFT 111 used as the drive transistor is connected to the power supply potential line VCCL102 arranged at the second column, the drain is connected to the node ND113, and the gate is connected to the node ND111. The drain of the TFT 112 is connected to the node ND113 (drain of the TFT 111), the source is connected to the anode side of the organic EL element 116, the gate is connected to the drive line DRL102 arranged at the second row, and the cathode of the light emitting element 116 is connected to the cathode line CSL of a predetermined potential (for example, ground potential). The source of the TFT 113 is connected to the node ND113 (drain of the TFT 111), the drain is connected to the node ND111 (gate of the TFT 111), and the gate is connected to the auto zero line AZL102 arranged at the second row. A first electrode of the capacitor C111 is connected to the node ND111, and a second electrode is connected to the node ND112. Further, a first electrode of the capacitor C112 is connected to the node ND111, and a second electrode is connected to the power supply potential line VCCL102 arranged at the second column. The source of the TFT 114 is connected to the node ND112, the drain is connected to the signal line SGL102 arranged at the second column, and the gate is connected to the scanning line SCNL102 arranged at the second row. The source of the TFT 115 is connected to the node ND112, and the drain is connected to the precharge potential line VPCL102 arranged at the second column.

The operation of the pixel circuit 101D is basically the same as that of the circuit of FIG. 11, so a detailed explanation is omitted here.

Here, the timing of the offset cancellation will be considered. In the fifth embodiment, the precharge potential lines VPCL are arranged parallel to the signal lines SGL. At this time, the number of pixels connected to one of the precharge potential lines VPCL parallel to the signal lines SGL and simultaneously offset cancelled is K. Usually, K is the offset cancellation period and the time necessary for the sufficient offset. It is usually 1 to several tens or less and small in comparison with the number of pixels simultaneously offset cancelled in the related art. Further, even when the resolution of the panel rises, K does not change. Accordingly, it becomes easy to hold the precharge potential at a stable potential.

As explained above, according to the fifth embodiment, n number of columns' worth of the power supply potential lines VCCL101 to VCCL10n for supplying the power voltage Vcc and n number of columns' worth of the precharge potential lines VPCL101 to VPCL10n for supplying the reference voltage Vpc for the offset cancellation are arranged for each pixel column in the same direction so as to be parallel to the signal lines SGL101 to SGL10n, therefore it is possible to stably and correctly supply a current of the desired value to the light emitting element of each pixel without regard to the variation of the threshold value of the active elements inside the pixels, it is possible to stably hold the reference potential even when there is an offset cancellation function by the precharge potential line, and it is possible to prevent a gradient from being formed in the luminance of the displayed image. As a result, it is possible to display a high quality image.

Further, in the fifth embodiment, the power supply potential lines VCCL are made common at the top and bottom of the display region constituted by the pixel array 102D in the figure, that is, the two ends of the plurality of power supply potential lines VCCL101 to VCCL10n are connected in common to make the potentials the same. Therefore, it is possible to prevent uneven luminance due to the potential difference in the length direction occurring between the top and bottom of the power supply potential lines VCCL in the figure.

Note that the pixel circuit 101D of FIG. 17 is an example, and the present embodiment is not limited to this. For example, as mentioned above, the TFT 112 to TFT 115 are only switches, therefore it is clear that it is also possible to configure all or part of them by p-channel TFTs or other switch elements.

Sixth Embodiment

Figure 19:
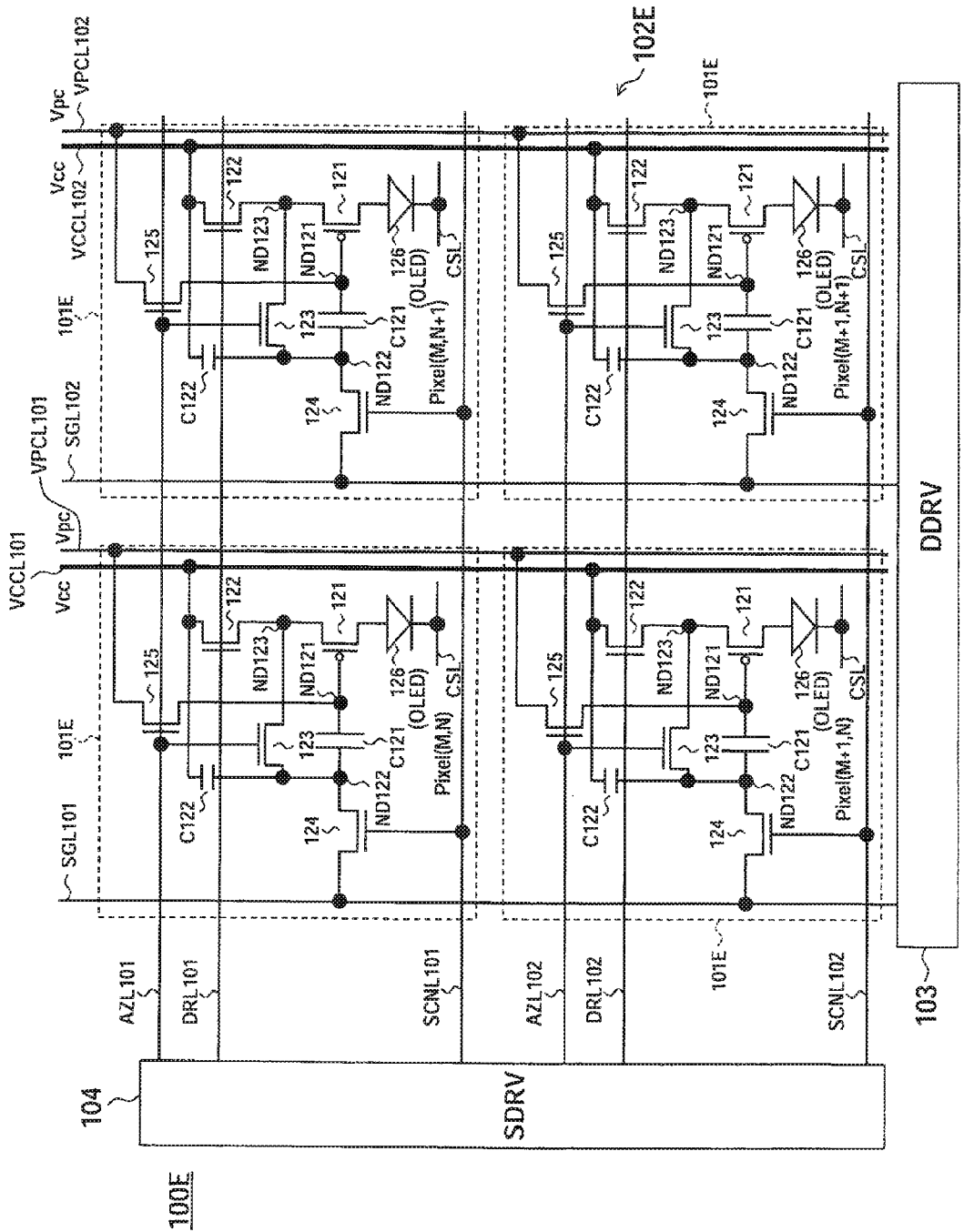
FIG. 19 is a circuit diagram of an active matrix type organic EL display (display device) according to a sixth embodiment of the present invention.

FIG. 19 is a circuit diagram of an active matrix type organic EL display device (display device) according to a sixth embodiment of the present invention.

The difference of the organic EL display 100E according to the sixth embodiment from the organic EL display 100B according to the second embodiment resides in that a non-mirror type circuit arrangement is provided. The rest of the configuration of the organic EL display 100E is the same as that of the third embodiment, so the same components of FIG. 19 as in FIG. 13 are represented by the same notations.

Each pixel circuit 101E according to the sixth embodiment has, as shown in FIG. 19, a p-channel TFT 121, n-channel TFT 122 to TFT 125, capacitors C121 and C122, a light emitting element 126 made of an organic EL element (electrooptic element), and nodes ND121 to ND123. Among these components, the TFT 121 forms the field effect transistor, TFT 122 forms the first switch, TFT 123 forms the second switch, TFT 125 forms the third switch, and TFT 124 forms the fourth switch. Further, the scanning line SCNL corresponds to the first control line. Note that the auto zero line AZL is commonly used as the control line for turning ON or OFF the TFT 125, but it is also able to perform the ON/OFF control by using another control line. Further, the supply line (power supply potential) of the power voltage $V_{cc}$ corresponds to the first reference potential, and the potential of the cathode line CSL (for example the ground potential GND) corresponds to the second reference potential.

Note that, in the pixel array 102E, the pixel circuits 101E are arranged in an m×n matrix, but in FIG. 19, an example of arranging them in a 2(=m)×2(=n) matrix is shown for simplification of the drawing. Further, in FIG. 19, the 2×2 pixel circuits are also labeled as "Pixel (M,N)", "Pixel (M,N+1)", "Pixel (M+1,N)", and "Pixel (M+1,N+1)".

Next, an explanation will be given of the specific configuration of each pixel circuit 101E.

In the pixel circuit "Pixel (M,N)" arranged at the first row and first column of FIG. 19, the source of the TFT 121 used as the drive transistor is connected to the node ND123 (connection point of the source of the TFT 122 and the drain of the TFT 123), the drain is connected to the anode side of the organic EL element 126, and the cathode of the light emitting element 126 is connected to the cathode line CSL of a predetermined potential (for example, the ground potential). The source of the TFT 122 is connected to the node ND123 (source of the TFT 121), the drain is connected to the power supply potential line VCCL101 arranged at the first column, and the gate is connected to the drive line DRL101 arranged at the first row. The drain of the TFT 123 is connected to the node ND123 (source of the TFT 121), the source is connected to the node ND122 (source of the TFT 124), and the gate is connected to the auto zero line AZL101 arranged at the first row. A first electrode of the capacitor C121 is connected to the node ND121, and a second electrode is connected to the node ND122. Further, a first electrode of the capacitor C122 is connected to the node ND122, and a second electrode is connected to the power supply potential line VCCL101 arranged at the first column. The source of the TFT 124 is connected to the node ND122, the drain is connected to the signal line SGL101 arranged at the first column, and the gate is connected to the scanning line SCNL101 arranged at the first row. The source of the TFT 125 is connected to the node ND121 (gate of the TFT 121), and the drain is connected to the precharge potential line VPCL101 arranged at the first column.

In the pixel circuit "Pixel (M+1,N)" arranged at the second row and first column of FIG. 19, the source of the TFT 121 used as the drive transistor is connected to the node ND123 (connection point of the source of the TFT 122 and the drain of the TFT 123), the drain is connected to the anode side of the organic EL element 126, and the cathode of the light emitting element 126 is connected to the cathode line CSL of a predetermined potential (for example, the ground potential). The source of the TFT 122 is connected to the node ND123 (source of the TFT 121), the drain is connected to the power supply potential line VCCL101 arranged at the first column, and the gate is connected to the drive line DRL102 arranged at the second row. The drain of the TFT 123 is connected to the node ND123 (source of the TFT 121), the source is connected to the node ND122 (source of the TFT 124), and the gate is connected to the auto zero line AZL102 arranged at the second row. A first electrode of the capacitor C121 is connected to the node ND121, and a second electrode is connected to the node ND122. Further, a first electrode of the capacitor C122 is connected to the node ND122, and a second electrode is connected to the power supply potential line VCCL101 arranged at the first column. The source of the TFT 124 is connected to the node ND122, the drain is connected to the signal line SGL101 arranged at the first column, and the gate is connected to the scanning line SCNL102 arranged at the second row. The source of the TFT 125 is connected to the node ND121 (gate of the TFT 121), and the drain is connected to the precharge potential line VPCL101 arranged at the first column.

In the pixel circuit "Pixel (M,N+1)" arranged at the first row and second column of FIG. 19, the source of the TFT 121 used as the drive transistor is connected to the node ND123 (connection point of the source of the TFT 122 and the drain of the TFT 123), the drain is connected to the anode side of the organic EL element 126, and the cathode of the light emitting element 126 is connected to the cathode line CSL of a predetermined potential (for example, the ground potential). The source of the TFT 122 is connected to the node ND123 (source of the TFT 121), the drain is connected to the power supply potential line VCCL102 arranged at the second column, and the gate is connected to the drive line DRL101 arranged at the first row. The drain of the TFT 123 is connected to the node ND123 (source of the TFT 121), the source is connected to the node ND122 (source of the TFT 124), and the gate is connected to the auto zero line AZL101 arranged at the first row. A first electrode of the capacitor C121 is connected to the node ND121, and a second electrode is connected to the node ND122. Further, a first electrode of the capacitor C122 is connected to the node ND122, and a second electrode is connected to the power supply potential line VCCL102 arranged at the second column. The source of the TFT 124 is connected to the node ND122, the drain is connected to the signal line SGL102 arranged at the second column, and the gate is connected to the scanning line SCNL101 arranged at the first row. The source of the TFT 125 is connected to the node ND121 (gate of the TFT 121), and the drain is connected to the precharge potential line VPCL102 arranged at the second column.

In the pixel circuit "Pixel (M+1,N+1)" arranged at the second column of the second row of FIG. 19, the source of the TFT 121 used as the drive transistor is connected to the node ND123 (connection point of the source of the TFT 122 and the drain of the TFT 123), the drain is connected to the anode side of the organic EL element 126, and the cathode of the light emitting element 126 is connected to the cathode line CSL of a predetermined potential (for example, the ground potential). The source of the TFT 122 is connected to the node ND123 (source of the TFT 121), the drain is connected to the power supply potential line VCCL102 arranged at the second column, and the gate is connected to the drive line DRL102 arranged at the second row. The drain of the TFT 123 is connected to the node ND123 (source of the TFT 121), the source is connected to the node ND122 (source of the TFT 124), and the gate is connected to the auto zero line AZL102 arranged at the second row. A first electrode of the capacitor C121 is connected to the node ND121, and a second electrode is connected to the node ND122. Further, a first electrode of the capacitor C122 is connected to the node ND122, and a second electrode is connected to the power supply potential line VCCL102 arranged at the second column. The source of the TFT 124 is connected to the node ND122, the drain is connected to the signal line SGL102 arranged at the second column, and the gate is connected to the scanning line SCNL102 arranged at the second row. The source of the TFT 125 is connected to the node ND121 (gate of the TFT 121), and the drain is connected to the precharge potential line VPCL102 arranged at the second column.

The operation of the pixel circuit 101E is basically the same as that of the circuit of FIG. 13, so a detailed explanation is omitted here.

Further, the timings of the offset cancellation will be considered. In the sixth embodiment as well, the precharge potential lines VPCL are arranged parallel to the signal lines SGL. At this time, the number of pixels connected to one of the precharge potential lines VPCL parallel to the signal lines SGL and simultaneously offset cancelled is K. Usually, K is the offset cancellation period and the time necessary for the sufficient offset. It is usually 1 to several tens or less and small in comparison with the number of pixels simultaneously offset cancelled in the related art. Further, even when the resolution of the panel rises, K does not change. Accordingly, it becomes easy to hold the precharge potential at a stable potential.

According to the sixth embodiment, there are the effects the same as those by the fifth embodiment mentioned above, that is, it is possible to stably and correctly supply a current of the desired value to the light emitting element of each pixel without regard to variation of the threshold value of the active elements inside the pixels, it is possible to stably hold the reference potential even when there is an offset cancellation function by the precharge potential line, and it is possible to prevent a gradient from being formed in the luminance of the displayed image. As a result, there is the advantage that a high quality image is able to be displayed.

Further, in the sixth embodiment as well, the power supply potential lines VCCL are made common at the top and bottom of the display region constituted by the pixel array 102E in the figure, that is, the two ends of the plurality of power supply potential lines VCCL101 to VCCL10n are connected in common to make the potentials the same. Therefore, it is possible to prevent uneven luminance due to the potential difference in the length direction occurring between the top and bottom of the power supply potential lines VCCL in the figure.

Note that the pixel circuit 101E of FIG. 19 is an example, and the present embodiment is not limited to this. For example, as mentioned above, the TFT 122 to TFT 125 are only switches, therefore it is clear that it is also possible to configure all or part of them by p-channel TFTs or other switch elements.

Seventh Embodiment

Figure 20:
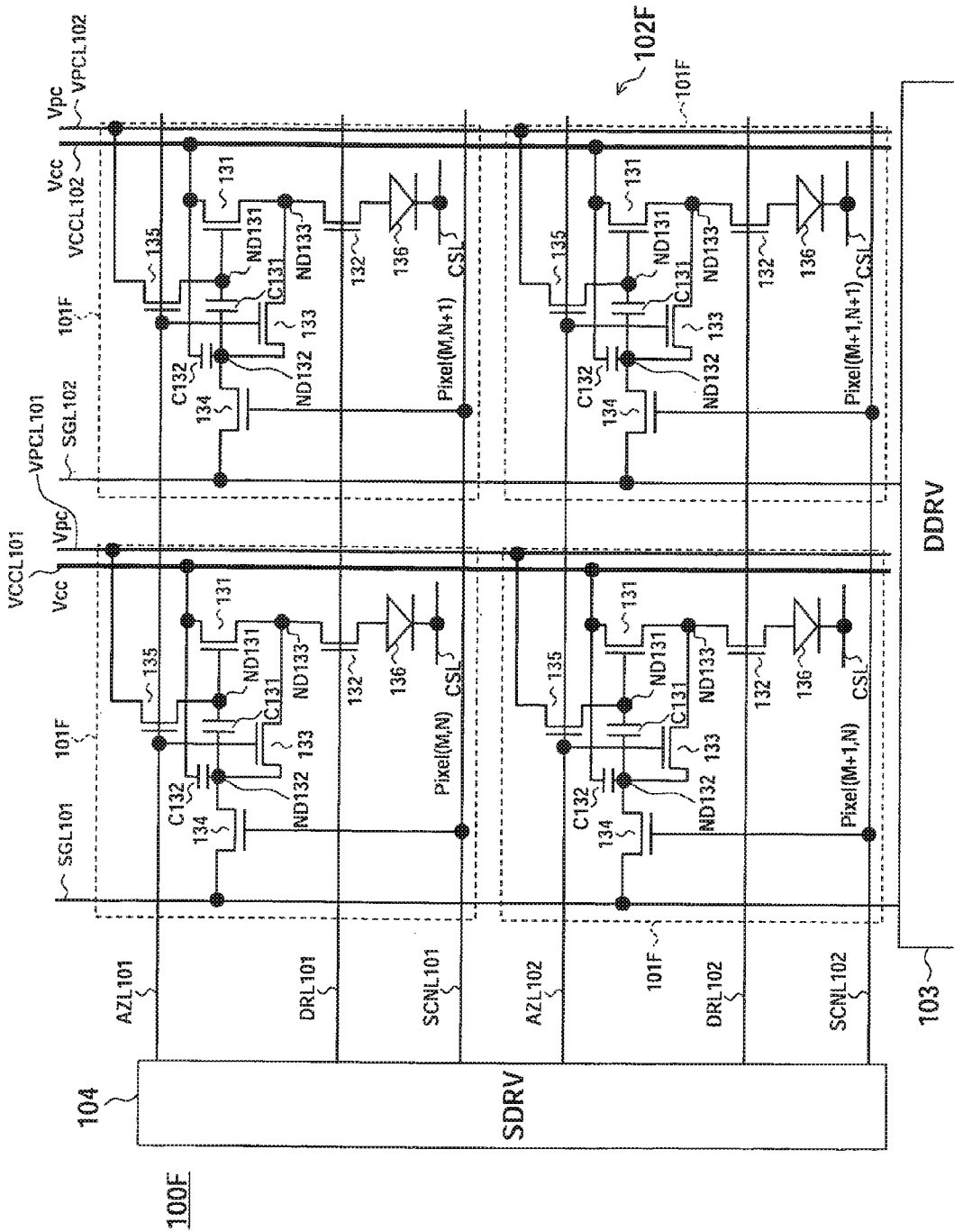
FIG. 20 is a circuit diagram of an active matrix type organic EL display (display device) according to a seventh embodiment of the present invention.

FIG. 20 is a circuit diagram of an active matrix type organic EL display device (display device) according to a seventh embodiment of the present invention.

The difference of the organic EL display 100F according to the seventh embodiment from the organic EL display 100C according to the fourth embodiment resides in that a non-mirror type circuit arrangement is provided. The rest of the configuration of the organic EL display 100F is the same as that of the fourth embodiment, so the same components of FIG. 20 as in FIG. 15 are represented by the same notations.

Each pixel circuit 101F according to the seventh embodiment has, as shown in FIG. 20, n-channel TFT 131 to TFT 135, capacitors C131 and C132, a light emitting element 136 made of an organic EL element OLED (electrooptic element), and nodes ND131 to ND133. Among these components, the TFT 131 forms the field effect transistor, TFT 132 forms the first switch, TFT 133 forms the second switch, TFT 135 forms the third switch, and TFT 134 forms the fourth switch. Further, the scanning line SCNL corresponds to the first control line. Note that, the auto zero line AZL is commonly used as the control line for turning ON or OFF the TFT 135, but it is also possible to perform the ON/OFF control by using another control line. Further, the supply line (power supply potential) of the power voltage $V_{cc}$ corresponds to the first reference potential, and the potential of the cathode line CSL (for example the ground potential GND) corresponds to the second reference potential.

Note that, in the pixel array 102F, pixel circuits 101F are arranged in an m×n matrix, but in FIG. 20, an example of arranging them in a 2(=m)×2(=n) matrix is shown for simplification of the drawing. Further, in FIG. 20, the 2×2 pixel circuits are also labeled as "Pixel (M,N)", "Pixel (M,N+1)", "Pixel (M+1,N)", and "Pixel (M+1,N+1)".

Next, an explanation will be given of the specific configuration of each pixel circuit 101F.

In the pixel circuit "Pixel (M,N)" arranged at the first row and first column of FIG. 20, the drain of the TFT 131 used as the drive transistor is connected to the power supply potential line VCCL101 arranged at the first column, the source is connected to the node ND133, and the gate is connected to the node ND131. The drain of the TFT 132 is connected to the node ND133 (source of the TFT 131), the source is connected to the anode side of the organic EL element 136, the gate is connected to the drive line DRL101 arranged at the first row, and the cathode of the light emitting element 136 is connected to the cathode line CSL of a predetermined potential (for example, the ground potential). The source of the TFT 133 is connected to the node ND133 (source of the TFT 131), the drain is connected to the node ND132 (source of the TFT 134), and the gate is connected to the auto zero line AZL101 arranged at the first row. A first electrode of the capacitor C101 is connected to the node ND131, and a second electrode is connected to the node ND132. Further, a first electrode of the capacitor C132 is connected to the node ND132, and a second electrode is connected to the power supply potential line VCCL101 arranged at the first column. The source of the TFT 134 is connected to the node ND132, the drain is connected to the signal line SGL101 arranged at the first column, and the gate is connected to the scanning line SCNL101 arranged at the first row. The source of the TFT 135 is connected to the node ND131, and the drain is connected to the precharge potential line VPCL101 arranged at the first column.

In the pixel circuit "Pixel (M+1,N)" arranged at the second row and first column of FIG. 20, the drain of the TFT 131 used as the drive transistor is connected to the power supply potential line VCCL101 arranged at the first column, the source is connected to the node ND133, and the gate is connected to the node ND131. The drain of the TFT 132 is connected to the node ND133 (source of the TFT 131), the source is connected to the anode side of the organic EL element 136, the gate is connected to the drive line DRL102 arranged at the second row, and the cathode of the light emitting element 136 is connected to the cathode line CSL of a predetermined potential (for example, the ground potential). The source of the TFT 133 is connected to the node ND133 (source of the TFT 131), the drain is connected to the node ND132 (source of the TFT 134), and the gate is connected to the auto zero line AZL102 arranged at the second row. A first electrode of the capacitor C131 is connected to the node ND131, and a second electrode is connected to the node ND132. Further, a first electrode of the capacitor C132 is connected to the node ND132, and a second electrode is connected to the power supply potential line VCCL101 arranged at the first column. The source of the TFT 134 is connected to the node ND131, the drain is connected to the signal line SGL101 arranged at the first column, and the gate is connected to the scanning line SCNL102 arranged at the second row. The source of the TFT 135 is connected to the node ND131, and the drain is connected to the precharge potential line VPCL101 arranged at the first column.

In the pixel circuit "Pixel (M,N+1)" arranged at the first row and second column of FIG. 20, the drain of the TFT 131 used as the drive transistor is connected to the power supply potential line VCCL102 arranged at the second column, the source is connected to the node ND133, and the gate is connected to the node ND131. The drain of the TFT 132 is connected to the node ND133 (source of the TFT 131), the source is connected to the anode side of the organic EL element 136, the gate is connected to the drive line DRL101 arranged at the first row, and the cathode of the light emitting element 136 is connected to the cathode line CSL of a predetermined potential (for example, the ground potential). The source of the TFT 133 is connected to the node ND133 (source of the TFT 131), the drain is connected to the node ND132 (source of the TFT 134), and the gate is connected to the auto zero line AZL101 arranged at the first row. A first electrode of the capacitor C131 is connected to the node ND131, and a second electrode is connected to the node ND132. Further, a first electrode of the capacitor C132 is connected to the node ND132, and a second electrode is connected to the power supply potential line VCCL102 arranged at the second column. The source of the TFT 134 is connected to the node ND132, the drain is connected to the signal line SGL102 arranged at the second column, and the gate is connected to the scanning line SCNL101 arranged at the first row. The source of the TFT 135 is connected to the node ND131, and the drain is connected to the precharge potential line VPCL102 arranged at the second column.

In the pixel circuit "Pixel (M+1,N+1)" arranged at the second row and second column of FIG. 20, the drain of the TFT 131 used as the drive transistor is connected to the power supply potential line VCCL102 arranged at the second column, the source is connected to the node ND133, and the gate is connected to the node ND131. The drain of the TFT 132 is connected to the node ND133 (source of the TFT 131), the source is connected to the anode side of the organic EL element 136, the gate is connected to the drive line DRL102 arranged at the second row, and the cathode of the light emitting element 136 is connected to the cathode line CSL of a predetermined potential (for example, the ground potential). The source of the TFT 133 is connected to the node ND133 (source of the TFT 131), the drain is connected to the node ND132 (source of the TFT 134), and the gate is connected to the auto zero line AZL102 arranged at the second row. A first electrode of the capacitor C131 is connected to the node ND131, and a second electrode is connected to the node ND132. Further, a first electrode of the capacitor C132 is connected to the node ND132, and a second electrode is connected to the power supply potential line VCCL102 arranged at the second column. The source of the TFT 134 is connected to the node ND132, the drain is connected to the signal line SGL102 arranged at the second column, and the gate is connected to the scanning line SCNL102 arranged at the second row. The source of the TFT 135 is connected to the node ND131, and the drain is connected to the precharge potential line VPCL102 arranged at the second column.

The biggest difference between the pixel circuit 101F of FIG. 20 and the pixel circuit 101E of FIG. 19 resides in that the TFT 131 used as the drive transistor for controlling the current flowing in the light emitting element (OLED) 136 is the n-channel, and the source thereof and the organic EL element (OLED) are connected via the TFT 132 as the switch.

The operation of the pixel circuit 101F is basically the same as that of the circuit of FIG. 15, so a detailed explanation thereof is omitted here.

According to the seventh embodiment, there are the effects the same as those by the fifth and sixth embodiments mentioned above, that is, it is possible to stably and correctly supply a current of the desired value to the light emitting element of each pixel without regard to the variation of the threshold value of the active elements inside the pixels, it is possible to stably hold the reference potential even when there is an offset cancellation function by the precharge potential line, and it is possible to prevent a gradient from being formed in the luminance of the displayed image. As a result, there is the advantage that high quality image is able to be displayed.

Further, in the seventh embodiment as well, the power supply potential lines VCCL are made common at the top and bottom of the display region constituted by the pixel array 102F in the figure, that is, the two ends of the plurality of power supply potential lines VCCL101 to VCCL10$n$ are connected in common to make the potentials the same. Therefore, it is possible to prevent uneven luminance due to the potential difference in the length direction occurring between the top and bottom of the power supply potential lines VCCL in the figure.

Note that the pixel circuit 101F of FIG. 20 is an example, and the present embodiment is not limited to this. For example, as mentioned above, the TFT 132 to TFT 135 are only switches, therefore it is clear that it is also possible to configure all or part of them by p-channel TFTs or other switch elements.

Eighth Embodiment

Figure 21:
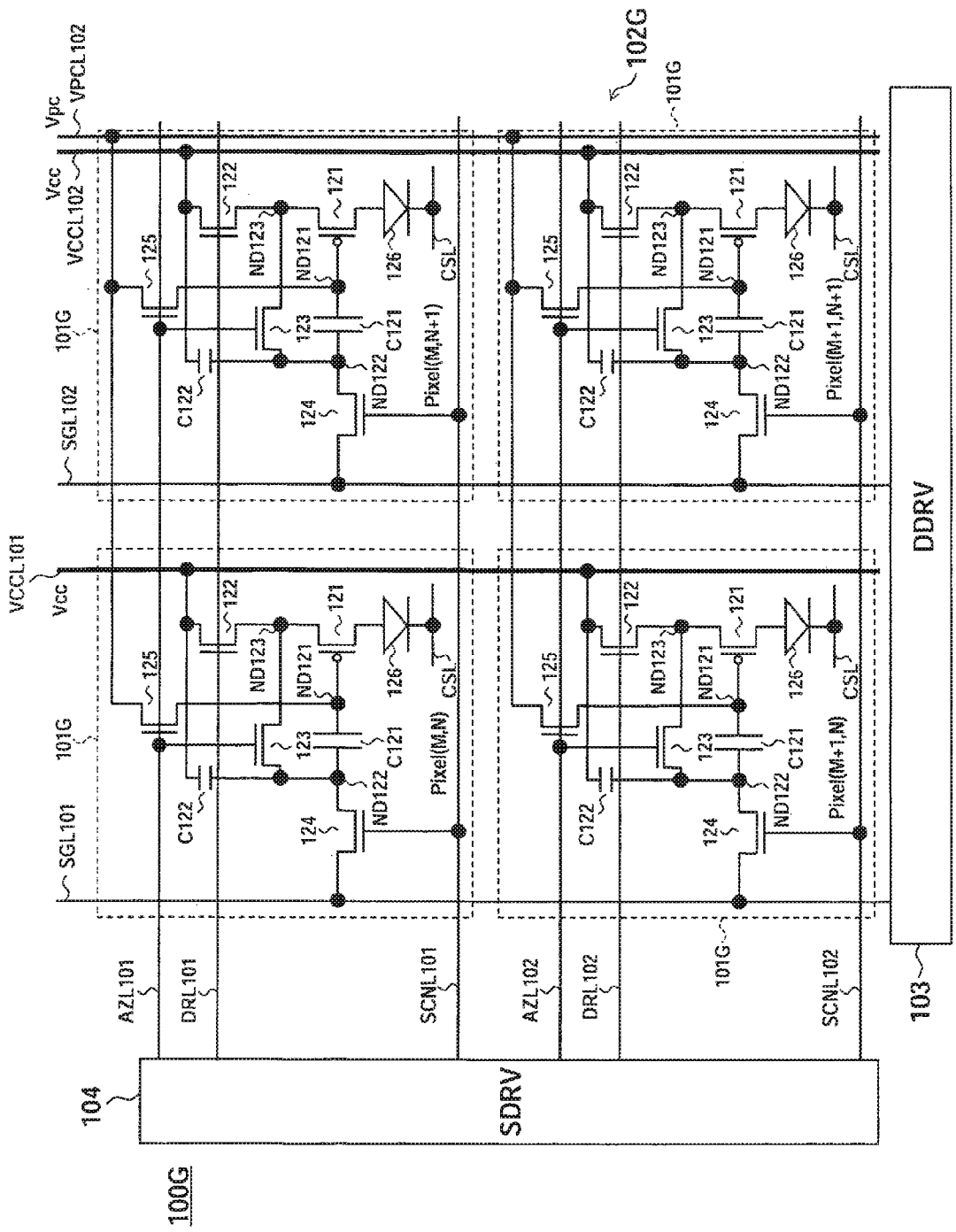
FIG. 21 is a circuit diagram of an active matrix type organic EL display (display device) according to an eighth embodiment of the present invention.
Figure 22:
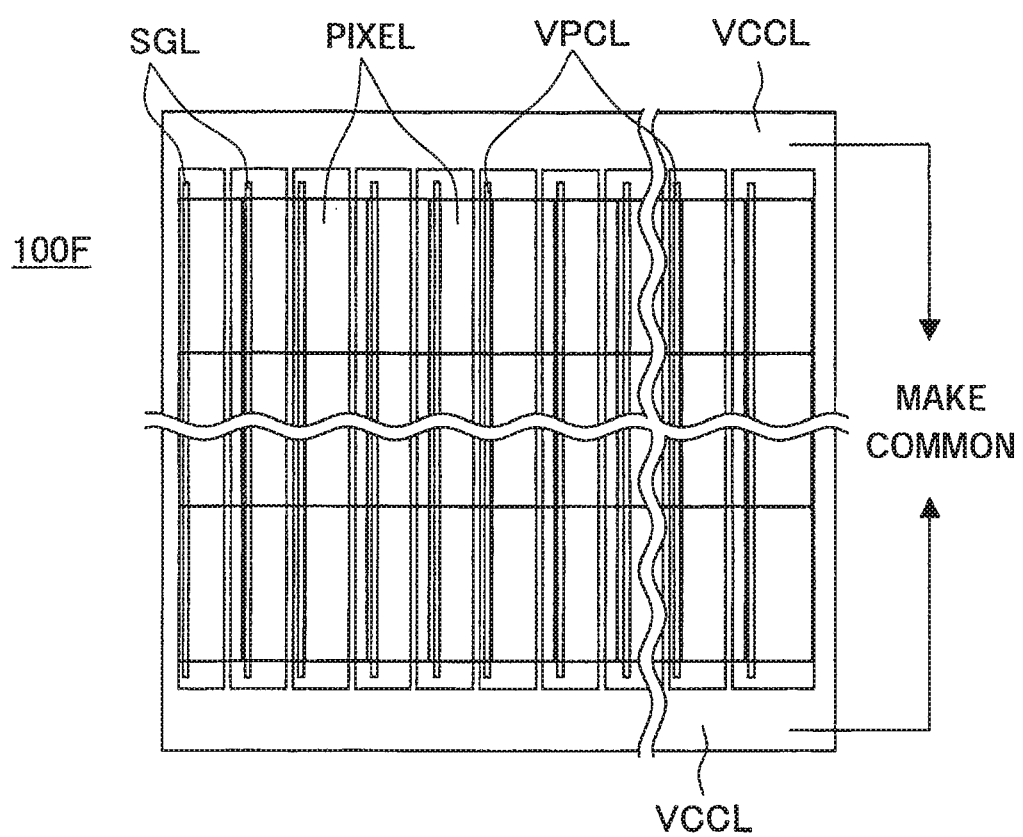
FIG. 22 is a diagram of a layout of power supply lines of the active matrix type organic EL display according to the eighth embodiment.

FIG. 21 is a circuit diagram of an active matrix type organic EL display device (display device) according to an eighth embodiment of the present invention. Further, FIG. 22 is a diagram of the layout of the power supply lines of the active matrix type organic EL display device according to the eighth embodiment.

The difference of the eighth embodiment from the above sixth embodiment resides in the point that the precharge potential lines VPCL are shared between two pixels adjacent in the scanning line direction. Due to this, it is possible to halve the number of precharge potential lines VPCL arranged in the signal line direction.

Further, it is also able to share the precharge lines of L pixels adjacent in the direction parallel to the scanning lines. In this case, the number of pixels connected to one of the precharge lines parallel to the signal lines and simultaneously offset cancelled is K×L. At this time, it is also possible if a suitable numerical value is selected within a range where the precharge line is able to be held at the stable potential as L.

As explained above, according to the present embodiment, it is possible to prevent crosstalk between pixels with a relatively simple layout. Further, it is possible to prevent the occurrence of uneven luminance in the displayed image, it is possible to stably and correctly supply a current of the desired value to the light emitting element of each pixel without regard to variation of the threshold value of the active elements inside pixels, and as a result it is possible to display a high quality image.

Further, according to the present embodiment, it is possible to stably and correctly supply a current of the desired value to the light emitting element of each pixel without regard to variation of the threshold value of the active elements inside the pixels, it is possible to stably hold the reference potential even when there is an offset cancellation function by the precharge potential line, it is possible to prevent a gradient from being formed in the luminance of the displayed image, and as a result of this it is possible to display a high quality image. Namely, without using a three-dimensional electromagnetic shield, it is possible to prevent crosstalk between pixels with a relatively simple layout of adding a single fixed potential line on a plane. Further, various variations can be applied as the fixed potential line. Further, there is the advantage that the uneven luminance does not occur between the top and bottom of the screen.

It should be understood by those skilled in the art that various modifications, combinations, sub-combinations, and alterations may occur depending on design requirements and other factors insofar as they are within the scope of the appended claims or the equivalents thereof.

What I claim is:

1. A display device comprising:
    a plurality of pixel circuits arranged in a matrix, the matrix including first, second and third columns respectively including columns of the pixel circuits extending along a column direction;
    signal lines extending along the column direction and configured for supplying data signals;
    scanning lines extending along a row direction perpendicular to the column direction and configured for supplying scan signals;
    precharge potential lines extending along the column direction; and
    power supply potential lines extending along the column direction,
    wherein one of the power supply potential lines is shared by pixel circuits in the first and second columns,
    wherein one of the precharge potential lines is shared by pixel circuits in the second and third columns,
    wherein the second column is adjacent to the first column, the second column is adjacent to the third column, and the second column is between the first column and the third column,
    wherein the one of the power supply potential lines is located between the first column and the second column, but none of the precharge potential lines are located between the first column and the second column,
    wherein the one of the precharge potential lines is located between the second column and the third column, but none of the power supply potential lines are located between the second column and the third column, and
    wherein transistors of a first pixel circuit in the first column and transistors of a second pixel circuit in the second column are arranged in a symmetrical manner with respect to an axis along the column direction.

2. A display device as set forth in claim 1, wherein the signal lines are arranged such that two of the signal lines are located between the second column and the third column and none of the signal lines are located between the first column and the second column, and wherein the one of the precharge potential lines is arranged between the two of the signal lines with no other lines therebetween, the two of the signal lines being connected to the pixel circuits of the second column and the third column, respectively.

3. A display device as set forth in claim 1, wherein pixel circuits of the first column and the second column sandwich an axis in the column direction therebetween and have a mirror type circuit arrangement symmetric with respect to the axis in the column direction.

4. A display device as set forth in claim 1, wherein at least one of the plurality of pixel circuits comprises:
    a sampling transistor configured to sample one of the data signals;
    a capacitor configured to store a voltage based on the sampled data signal;
    a light emitting element configured to emit light in accordance with the voltage stored in the capacitor;
    a driving transistor configured to supply current to the light emitting element;
    a potential supply transistor configured to supply a precharge potential voltage to a node of the capacitor.

5. A display device as set forth in claim 4, wherein a first current electrode of the potential supply transistor is connected directly to the capacitor.

6. A display device as set forth in claim 4, further comprising:
    auto zero lines, wherein a gate electrode of the sampling transistor is connected to one of the scanning lines, and a gate electrode of the potential supply transistor is connected to one of the auto zero lines.

7. A display device as set forth in claim 4, wherein the auto zero lines extend along the row direction.

8. A display device as set forth in claim 4, wherein said at least one of the plurality of pixel circuits further comprises:
    a first switch transistor connected between the driving transistor and the light emitting element, wherein one of the source and drain electrodes of the first switch transistor is connected to one of the source and drain electrodes of the driving transistor through a first node, and an other one of the source and drain electrodes of the first switch transistor is connected to the light emitting element;

a second switch transistor connected between one end of the capacitor and the first node, wherein one of the source and drain electrodes of the second switch transistor is connected to the capacitor and an other one of the source and drain electrodes of the second switch transistor is connected to the first node.

9. A display device as set forth in claim 4, wherein at least the driving transistor is configured as a p-channel TFT.

10. A display device as set forth in claim 8, wherein the sampling transistor, the driving transistor, the potential supply transistor, the first switch transistor and the second switch transistor are configured as p-channel TFTs.

11. A display device as set forth in claim 1, further comprising:

control circuitry configured to perform an offset cancellation function for each of the plurality of pixel circuits, whereby variation of luminance caused by differences in threshold voltages of drive transistors is canceled.

12. A display device as set forth in claim 11, wherein the control circuitry is configured to perform the offset cancellation function for those of the plurality of pixels that are connected to the one of the precharge lines simultaneously.

13. A display device as set forth in claim 1, wherein two ends of each of the power supply potential lines are all connected to each other by a current path other than the power supply potential lines so as to become common and made the same potential.

14. A display device as set forth in claim 2, further comprising:

control circuitry configured to sequentially write two of the data signals from the signal lines into two of the pixel circuits, the two pixel circuits being adjacent to each other in the same row and sharing a precharge potential line, such that:

each respective one of the two data signals is written into only one of the two of the pixel circuits at a time;

the writing of the two data signals into both of the two of the pixel circuits is performed while the precharge potential line shared by the two of the pixel circuits is supplying a precharge potential; and crosstalk between signal lines connected to the two of the pixel circuits is prevented.

15. A display device as set forth in claim 1, wherein the display device is an organic electroluminescence image display device.

16. A display device as set forth in claim 4, wherein the display device is an organic electroluminescence image display device and wherein the light emitting element is an organic electroluminescence element.

17. A display device as set forth in claim 1, wherein the plurality of signal lines are arranged such that, for each pair of adjacent columns of the plurality of pixel circuits that has a precharge potential line disposed between the adjacent columns thereof, two of the plurality of signal lines are also disposed between the adjacent columns thereof, with the precharge potential line being disposed between the two of the plurality of signal lines with no other lines therebetween, each of the plurality of signal lines being connected to an adjacent column of pixel circuits.

18. A display device as set forth in claim 17, further comprising:

control circuitry configured to sequentially write two of the data signals from the signal lines into two pixel circuits of the plurality of pixel circuits, the two pixel circuits being adjacent to each other in the same row and sharing a precharge potential line, such that:

each respective one of the two data signals is written into only one of the corresponding two pixel circuits at a time;

the writing of the two data signals into both of the two pixel circuits is performed while the precharge potential line shared by the two pixel circuits is supplying a precharge potential; and crosstalk between signal lines connected to the two pixel circuits is prevented.

19. A display device comprising:

a plurality of pixel circuits arranged in a matrix having rows and columns, wherein the pixel circuits includes a plurality of pairs of the pixel circuits which are adjacent to each other in a row direction;

a plurality of signal lines for supplying data signals;

a plurality of precharge potential lines arranged between adjacent columns of the pixel circuits;

a plurality of power supply potential lines arranged between adjacent columns of the pixel circuits, wherein the plurality of precharge potential lines and the plurality of power supply potential lines are alternately disposed between columns of the plurality of pixel circuits such that no adjacent columns of the pixel circuits have both one of the precharge potential lines and one of the power supply potential lines disposed therebetween, and wherein, for each of the pairs of the pixel circuits, the pixel circuits of the pair share in common the one of the precharge potential lines and the power supply potential lines disposed therebetween, and wherein each of the pairs of the pixel circuits includes a first pixel circuit and a second pixel circuit, and transistors of the first pixel circuit and transistors of the second pixel circuit are arranged in a symmetrical manner with respect to an axis along the column direction.

20. A display device as set forth in claim 19, wherein either of the plurality of precharge potential lines or the plurality of power supply potential lines are arranged between every adjacent columns.

* * * * *